(12) United States Patent
Milliron et al.

(10) Patent No.: US 10,515,736 B2
(45) Date of Patent: Dec. 24, 2019

(54) NANOSTRUCTURED CONDUCTING FILMS WITH A HETEROGENEOUS DOPANT DISTRIBUTION AND METHODS OF MAKING AND USE THEREOF

(71) Applicant: Board of Regents, The University of Texas System, Austin, TX (US)

(72) Inventors: Delia Milliron, Austin, TX (US); Byung Hyo Kim, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 199 days.

(21) Appl. No.: 15/377,089

(22) Filed: Dec. 13, 2016

(65) Prior Publication Data

US 2017/0169913 A1    Jun. 15, 2017

Related U.S. Application Data

(60) Provisional application No. 62/267,440, filed on Dec. 15, 2015.

(51) Int. Cl.
| | |
|---|---|
| *H01B 1/16* | (2006.01) |
| *G06F 3/041* | (2006.01) |
| *H01L 31/0224* | (2006.01) |
| *C23C 26/00* | (2006.01) |
| *H01B 5/14* | (2006.01) |

(52) U.S. Cl.
CPC ............... *H01B 1/16* (2013.01); *C23C 26/00* (2013.01); *G06F 3/041* (2013.01); *H01B 5/14* (2013.01); *H01L 31/022466* (2013.01); *G06F 2203/04103* (2013.01)

(58) Field of Classification Search
CPC ..... H01B 1/16; H01B 5/14; H01L 31/022466; G06F 3/041; G06F 2203/04103; C23C 26/00
USPC ............................... 252/520.1, 518.1, 519.51
See application file for complete search history.

(56) References Cited

U.S. PATENT DOCUMENTS

| | | | | |
|---|---|---|---|---|
| 8,404,302 | B2 * | 3/2013 | Maa ..................... | H01L 31/0236 427/126.3 |
| 8,865,027 | B2 * | 10/2014 | Alden ..................... | B82Y 30/00 252/514 |
| 2011/0240932 | A1 | 10/2011 | Mitzi et al. | |
| 2012/0104325 | A1 * | 5/2012 | Talapin ................. | B82Y 30/00 252/502 |
| 2014/0048137 | A1 | 2/2014 | Cao et al. | |
| 2014/0170818 | A1 | 6/2014 | Sirringhaus et al. | |
| 2014/0220362 | A1 * | 8/2014 | Milliron ................... | C09K 9/00 428/432 |
| 2015/0062687 | A1 * | 3/2015 | Milliron ................ | G02F 1/1508 359/275 |
| 2015/0109652 | A1 * | 4/2015 | Milliron ................. | B82Y 20/00 359/275 |
| 2015/0277202 | A1 * | 10/2015 | Mattox ................. | G02F 1/1523 359/275 |
| 2015/0333212 | A1 | 11/2015 | Jacob et al. | |
| 2017/0031224 | A1 * | 2/2017 | Gil ......................... | C01G 33/00 |
| 2017/0108752 | A1 * | 4/2017 | Milliron ................ | G02F 1/0147 |

OTHER PUBLICATIONS

Coutts, et al., "Transparent Conducting Oxides: Status and Opportunities in Basic Research", Presented at the 195th Meeting of the Electrochemical Society Seattle, Washington May 2-6, 1999, 17 pages.

Dyer, "Preparation and piezoresistive properties of reactively sputtered indium tin oxide thin films", Thin Solid Films 288, 1996, 279-286.

Kim, et al., "Low-temperature fabrication of high-performance metal oxide thin-film electronics via combustion processing", Nature Materials 10, 2011, 382-388.

Lee, et al., "A Facile Solution-Phase Approach to Transparent and Conducting ITO Nanocrystal Assemblies", J. Am. Chem. Soc. 134, 2012, 13410-13414.

Lee, et al., "Surface Modification and Assembly of Transparent Indium Tin Oxide Nanocrystals for Enhanced Conductivity", J. Phys. Chem. C 118, 2014, 12017-12021.

Qin, et al., "Synthesis of single-crystal nanoparticles of indium oxide by "urea glass" method and their electrochemical properties", Materials Letters 91, 2013, 5-8.

Seki, et al., "Indium—tin-oxide thin films prepared by dip-coating of indium diacetate monohydroxide and tin dichloride", Thin Solid Film 388, 2001, 22-26.

(Continued)

*Primary Examiner* — Douglas J McGinty
(74) *Attorney, Agent, or Firm* — Meunier Carlin & Curfman LLC

(57) ABSTRACT

Disclosed herein are nanostructured conducting films. The nanostructured conducting films can comprise a nanocrystal phase comprising a plurality of nanocrystals comprising a first metal chalcogenide, the nanocrystal phase being dispersed within a continuous phase comprising a second metal chalcogenide, and wherein the nanocrystal phase, the continuous phase, or a combination thereof further comprises a dopant. In some examples, the first metal chalcogenide and/or the second metal chalcogenide comprise a metal oxide. Also disclosed herein are transparent conducting oxide films having heterogeneous dopant distributions, the films having high mobility, good conductivity, or combinations thereof. Also described herein are methods of making and methods of use of the nanostructured conducing films described herein.

22 Claims, 13 Drawing Sheets

(56) References Cited

OTHER PUBLICATIONS

Sohn, et al., "Transparent Conductive Oxide (TCO) Films for Organic Light Emissive Devices (OLEDs)", Organic Light Emitting Diode—Material, Process and Devices Available from: http://www.intechopen.com/books/organic-lightemitting-diode-material-process-and-devices/transparent-conductive-oxide-tco-films-for-organic-light-emissivedevices-oleds, ISBN: 978-953-307-273-9, InTech, 2011, 43 pages.

Stadler, "Transparent Conducting Oxides—An Up-To-Date Overview", Materials 5, 2012, 661-683.

Tahar, et al., "Tin doped indium oxide thin films: Electrical properties", J. Appl. Phys.83, 1998, 2631-2645.

International Search Report and Written Opinion issued in International Application No. PCTUS201666321, dated Mar. 10, 2017.

\* cited by examiner

NANOSTRUCTURED CONDUCTING FILMS WITH A HETEROGENEOUS DOPANT DISTRIBUTION AND METHODS OF MAKING AND USE THEREOF

CROSS-REFERENCE TO RELATED APPLICATIONS

This application claims the benefit of U.S. Provisional Application No. 62/267,440, filed Dec. 15, 2015, which is hereby incorporated herein by reference in its entirety.

STATEMENT OF GOVERNMENT SUPPORT

This invention was made with government support under Grant No. EEC-1160494 awarded by the National Science Foundation. The government has certain rights in this invention.

BACKGROUND

Transparent conducting oxides (TCO) are widely used in modern life for displays, touch panels, solar cells, and smart windows. TCOs should have a large band gap to be transparent (e.g., >3.2 eV), and high mobility and carrier concentration to be conductive. Main group metals (e.g., with a closed $d^{10}$ orbital) oxides such as indium oxide, tin oxide, and zinc oxide, are known to be good TCO materials because of their high mobility which originates from the overlap of the conduction band, which is mostly composed of s orbitals, and a large band gap (e.g., >3.2 eV). High carrier concentration can be achieved by aliovalent doping to the host metal oxides, such as tin doped indium oxide (e.g., indium-tin oxide, ITO). However, increasing the carrier concentration can often decrease the mobility because the aliovalent doping ions can act as scattering centers for the electrons. This inverse relationship between mobility and carrier concentration can limit the conductivity of TCO films. The compositions and methods discussed herein addresses these and other needs.

SUMMARY

Disclosed herein are nanostructured conducting films. The nanostructured conducting films can comprise a nanocrystal phase comprising a plurality of nanocrystals comprising a first metal chalcogenide, the nanocrystal phase being dispersed within a continuous phase comprising a second metal chalcogenide, wherein the nanocrystal phase, the continuous phase, or combinations thereof further comprises a dopant.

In some examples, the first metal chalcogenide can comprise a metal oxide, a metal sulfide, a metal selenide, or combinations thereof. In some examples, the first metal chalcogenide can comprise a metal oxide. Examples of metal oxides include simple metal oxides (e.g., with a single metal element) and mixed metal oxides (e.g., with different metal elements). The metal oxide can, for example, comprise a metal selected from the group consisting of Cd, Cr, Cu, Ga, In, Ni, Sn, Ti, W, Zn, and combinations thereof. Examples of metal oxides include, but are not limited to, CdO, $CdIn_2O_4$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, and combinations thereof. In some examples, the first metal chalcogenide can comprise a metal sulfide. The metal sulfide can, for example, comprise a metal selected from the group consisting of Cd, Cu, Pb, Zn, and combinations thereof. Examples of metal sulfides include, but are not limited to, CdS, CuS, PbS, ZnS, or combinations thereof.

In some examples, the nanocrystal phase further comprises a dopant. In some examples, the dopant can comprise an n-type dopant. The dopant can, for example, comprise Al, B, Ce, Cl, Cs, Dy, Er, Eu, F, Ga, Gd, Ho, In, La, Mg, Mo, N, Nb, Nd, Sb, Sn, Sm, Tb, or combinations thereof. The concentration of dopant in the nanocrystal phase can, for example, be from 0.1% to 20%.

The plurality of nanocrystals can have an average particle size, for example, of from 1 nm to 200 nm (e.g., from 1 nm to 100 nm). In some examples, each nanocrystal within the nanocrystal phase can be separated from its neighboring nanocrystals by an average distance that is less than the average particle size of the plurality of nanocrystals. In some examples, the average density of the plurality of nanocrystals in the nanostructured conducting film is from $10^{15}$ to $10^{20}$ nanocrystals/cm$^3$. In some examples, the plurality of nanocrystals are substantially spherical in shape.

In some examples, the second metal chalcogenide can comprise a metal oxide, a metal sulfide, a metal selenide, or combinations thereof. In some examples, the second metal chalcogenide can comprise a metal oxide. Examples of metal oxides include simple metal oxides (e.g., with a single metal element) and mixed metal oxides (e.g., with different metal elements). The metal oxide can, for example, comprise a metal selected from the group consisting of Cd, Cr, Cu, Ga, In, Ni, Sn, Ti, W, Zn, and combinations thereof. Examples of metal oxides include, but are not limited to, CdO, $CdIn_2O_4$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, and combinations thereof. In some examples, the second metal chalcogenide can comprise a metal sulfide. The metal sulfide can, for example, comprise a metal selected from the group consisting of Cd, Cu, Pb, Zn, and combinations thereof. Examples of metal sulfides include, but are not limited to, CdS, CuS, PbS, ZnS, or combinations thereof. In some examples, the first metal chalcogenide and the second metal chalcogenide are the same.

In some examples, the continuous phase can further comprise a dopant. In some examples, the dopant can comprise an n-type dopant. The dopant can, for example, comprise Al, B, Ce, Cl, Cs, Dy, Er, Eu, F, Ga, Gd, Ho, In, La, Mg, Mo, N, Nb, Nd, Sb, Sn, Sm, Tb, or combinations thereof. The concentration of dopant in the continuous phase can, for example, be from 0.1% to 20%.

In some examples, the nanostructured conducting films can be substantially optically transparent. For example, the nanostructured conducting film can have an average transmittance of 75% or more at one or more wavelengths from 350 nm to 800 nm (e.g., 85% or more, 90% or more).

In some examples, the nanostructured conducting film can have a sheet resistivity of from 1 Ω/sq. to 1000 Ω/sq. In some examples, the nanostructured conducting film can have a sheet resistivity of 50 Ω/sq. or less. In some examples, the nanostructured conducting film can have a resistivity of 5×10$^{-4}$ Ω·cm or less. In some examples, the nanostructured conducting film can have a carrier concentration of 5×10$^{18}$ cm$^{-3}$ or more. In some examples, the nanostructured conducting film can have a mobility of 10 cm$^2$V·s or more (e.g., 15 cm$^2$V·s or more). The nanostructured conducting film can, for example, have a conductivity of from 200 S/cm to 10,000 S/cm. In some examples, the nanostructured conducting film can have a conductivity of 500 S/m or more (e.g., 700 S/m or more).

In some examples, the nanostructured conducting films can comprise nanostructured transparent conducting oxide composite films. The nanostructured conducting films described herein can, for example, comprise transparent conducting oxide (TCO) films with heterogeneous dopant distribution.

Also described herein are methods of making the nanostructured conducing films described herein. For example, also disclosed herein are methods of making the nanostructured conducting films described herein, the method comprising: depositing the plurality of nanocrystals on a substrate, thereby forming the nanocrystal phase; contacting the nanocrystal phase with a metal chalcogenide precursor, thereby forming an impregnated nanocrystal phase; and thermally annealing the impregnated nanocrystal phase, thereby forming the nanostructured conducting film. Depositing the plurality of nanocrystals can, for example, comprise printing, lithographic deposition, spin coating, drop-casting, zone casting, dip coating, blade coating, spraying, vacuum filtration, slot die coating, curtain coating, or combinations thereof. In some examples, the nanocrystal phase is contacted with the metal chalcogenide precursor for from 0.1 seconds to 1 hour.

Also disclosed herein are methods of making the nanostructured conducting films described herein, the method comprising: dispersing the plurality of nanocrystals in a solution comprising a metal chalcogenide precursor, thereby forming a mixture; depositing the mixture on a substrate, thereby forming an impregnated nanocrystal phase; and thermally annealing the impregnated nanocrystal phase, thereby forming the nanostructured conducting film. Depositing the mixture can, for example, comprise printing, lithographic deposition, spin coating, drop-casting, zone casting, dip coating, blade coating, spraying, vacuum filtration, slot die coating, curtain coating, or combinations thereof.

The substrate can comprise any suitable substrate, for example, glass, quartz, silicon, a transparent polymer, MgO, Si, $TiO_2$, TaO, or combinations thereof.

Thermally annealing the impregnated nanocrystal phase can, in some examples, comprise heating the impregnated nanocrystal phase at a temperature of from 200° C. to 800° C.

The impregnated nanocrystal phase can, for example, be thermally annealed for from 1 minute to 12 hours.

The impregnated nanocrystal phase can be thermally annealed, for example, in air, $H_2$, $N_2$, Ar, or combinations thereof.

In some examples, the metal chalcogenide precursor can comprise a solution comprising a metal salt.

In some examples, the methods can further comprise forming the plurality of nanocrystals.

Also provided herein are methods of use of the nanostructured conducting films described herein. In some examples, the nanostructured conducing films described herein can be used in various articles of manufacture including electronic devices, energy storage devices, energy conversion devices, optical devices, optoelectronic devices, or combinations thereof. Examples of articles of manufacture (e.g., devices) using the nanostructured conducting films described herein can include, but are not limited to touch panels, electronic displays, transistors, smart windows, solar cells, fuel cells, photovoltaic cells, and combinations thereof.

Additional advantages will be set forth in part in the description that follows or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
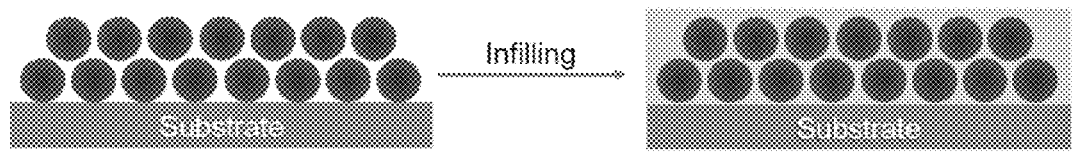
FIG. 1 is a schematic illustration of infiltration, or infilling, of a nanocrystal array.

The methods and compositions described herein may be understood more readily by reference to the following detailed description of specific aspects of the disclosed subject matter and the Examples included therein.

Before the present methods and compositions are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

General Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

"Optional" or "optionally" means that the subsequently described event or circumstance can or cannot occur, and that the description includes instances where the event or circumstance occurs and instances where it does not.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

Nanostructured Conducting Films

Disclosed herein are nanostructured conducting films. As used herein, "nanostructured" means any structure with one or more nanosized features. A nanosized feature can be any feature with at least one dimension less than 1 µm in size. For example, a nanosized feature can comprise a nanowire, nanotube, nanoparticle, nanopore, and the like, or combinations thereof. As such, the nanostructured conducting film can comprise, for example, a nanowire, nanotube, nanoparticle, nanopore, or a combination thereof. In some examples, the nanostructured conducting film can comprise a material that is not nanosized but has been modified with a nanowire, nanotube, nanoparticle, nanopore, or a combination thereof.

The nanostructured conducting films can comprise a nanocrystal phase comprising a plurality of nanocrystals comprising a first metal chalcogenide, the nanocrystal phase being dispersed within a continuous phase comprising a second metal chalcogenide, wherein the nanocrystal phase, the continuous phase, or combinations thereof further comprises a dopant. As used herein, a "metal chalcogenide" refers to a compound comprising a metal and a chalcogen. As used herein a "chalcogen" refers to any element from group 16, such as oxygen, sulfur, selenium, tellurium, and polonium. As such, metal chalcogenides can include metal oxides, metal sulfides, and metal selenides, among others.

"Phase," as used herein, generally refers to a region of a material having a substantially uniform composition which is a distinct and physically separate portion of a heterogeneous system. The term "phase" does not imply that the material making up a phase is a chemically pure substance, but merely that the chemical and/or physical properties of the material making up the phase are essentially uniform throughout the material, and that these chemical and/or physical properties differ significantly from the chemical and/or physical properties of another phase within the material. Examples of physical properties include density, thickness, aspect ratio, specific surface area, porosity and dimensionality. Examples of chemical properties include chemical composition.

"Continuous," as used herein, generally refers to a phase such that all points within the phase are directly connected, so that for any two points within a continuous phase, there exists a path which connects the two points without leaving the phase.

The first metal chalcogenide can, for example, be selected to tune the optical and/or electrical properties of the nanostructured conducting film. In some examples, the first metal chalcogenide can comprise a metal oxide, a metal sulfide, a metal selenide, or combinations thereof.

In some examples, the first metal chalcogenide can comprise a metal oxide. Examples of metal oxides include simple metal oxides (e.g., with a single metal element) and mixed metal oxides (e.g., with different metal elements). The metal oxide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal oxide can comprise a metal selected from the group consisting of Cd, Cr, Cu, Ga, In, Ni, Sn, Ti, W, Zn, and combinations thereof. Examples of metal oxides include, but are not limited to, CdO, $CdIn_2O_4$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, and combinations thereof.

In some examples, the first metal chalcogenide can comprise a metal sulfide. The metal sulfide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal sulfide can comprise a metal selected from the group consisting of Cd, Cu, Pb, Zn, and combinations thereof. Examples of metal sulfides include, but are not limited to, CdS, CuS, PbS, ZnS, or combinations thereof.

In some examples, the first metal chalcogenide can comprise a metal selenide. The metal selenide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. Examples of metal selenides include, but are not limited to, CuSe.

In some examples, the nanocrystal phase can further comprise a dopant. The dopant can comprise any suitable dopant for the first metal chalcogenide. The dopant can, for example, be selected to tune the optical and/or electronic properties of the nanostructured conducting film. In some examples, the dopant can comprise an n-type dopant. The dopant can, for example, comprise Al, B, Ce, Cl, Cs, Dy, Er, Eu, F, Ga, Gd, Ho, In, La, Mg, Mo, N, Nb, Nd, Sb, Sn, Sm, Tb, or combinations thereof.

The amount of dopant in the nanocrystal phase can, for example, be selected to tune the optical and/or electronic properties of the nanostructured conducting film. In some examples, the concentration of the dopant in the nanocrystal phase can be 0.1% or more (e.g., 0.5% or more, 1% or more, 2% or more, 3% or more, 4% or more, 5% or more, 6% or more, 7% or more, 8% or more, 9% or more, 10% or more, 11% or more, 12% or more, 13% or more, 14% or more, 15% or more, 16% or more, 17% or more, 18% or more, or 19% or more). In some examples, the concentration of the dopant in the nanocrystal phase can be 20% or less (e.g., 19% or less, 18% or less, 17% or less, 16% or less, 15% or less, 14% or less, 13% or less, 12% or less, 11% or less, 10% or less, 9% or less, 8% or less, 7% or less, 6% or less, 5% or less, 4% or less, 3% or less, 2% or less, 1% or less, or 0.5% or less). The concentration of the dopant in the nanocrystal phase can range from any of the minimum values described above to any of the maximum values described above. For example, the concentration of the dopant in the nanocrystal phase can be from 0.1% to 20% (e.g., from 0.1% to 10%, from 10% to 20%, from 0.1% to 5%, from 5% to 10%, from 10% to 15%, from 15% to 20%, or from 1% to 15%). In some examples, the concentration of the dopant in the nanocrystal phase can be 20% or more (e.g., 25% or more, 30% or more, 35% or more, 40% or more, 45% or more, or 50% or more). The concentration of the dopant can, for example, be a molar percent.

The plurality of nanocrystals can have an average particle size. "Average particle size," "mean particle size," and "median particle size" are used interchangeably herein, and generally refer to the statistical mean particle size of the nanocrystals in a population of nanocrystals. For example, the average particle size for a plurality of nanocrystals with a substantially spherical shape can comprise the average diameter of the plurality of nanocrystals. For a nanocrystal with a substantially spherical shape, the diameter of a nanocrystal can refer, for example, to the hydrodynamic diameter. As used herein, the hydrodynamic diameter of a nanocrystal can refer to the largest linear distance between two points on the surface of the nanocrystal. Mean particle size can be measured using methods known in the art, such as evaluation by scanning electron microscopy, transmission electron microscopy, and/or dynamic light scattering.

In some examples, the plurality of nanocrystals can have an average particle size of 1 nanometer (nm) or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 60 nm or more, 70 nm or more, 80 nm or more, 90 nm or more, 100 nm or more, 110 nm or more, 120 nm or more, 130 nm or more, 140 nm or more, 150 nm or more, 160 nm or more, 170 nm or more, 180 nm or more, or 190 nm or more). In some examples, the plurality of nanocrystals can have an average particle size of 200 nm or less (e.g., 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, 5 nm or less, 4 nm or less, 3 nm or less, or 2 nm or less).

The average particle size of the plurality of nanocrystals can range from any of the minimum values described above to any of the maximum values described above. For example, the plurality of nanocrystals can have an average particle size of from 1 nm to 200 nm (e.g., from 1 nm to 100 nm, from 100 nm to 200 nm, from 1 nm to 50 nm, from 50 nm to 100 nm, from 100 nm to 150 nm, from 150 nm to 200 nm, from 1 nm to 90 nm, from 1 nm to 80 nm, from 1 nm to 70 nm, or from 1 nm to 25 nm).

In some examples, the plurality of nanocrystals can be substantially monodisperse. "Monodisperse" and "homogeneous size distribution," as used herein, and generally describe a population of nanocrystals where all of the nanocrystals are the same or nearly the same size. As used herein, a monodisperse distribution refers to nanocrystals distributions in which 70% of the distribution (e.g., 75% of the distribution, 80% of the distribution, 85% of the distribution, 90% of the distribution, or 95% of the distribution) lies within 25% of the median particle size (e.g., within 20% of the median particle size, within 15% of the median particle size, within 10% of the median particle size, or within 5% of the median particle size).

In some examples, each nanocrystal in the nanocrystal phase can be separated from its neighboring nanocrystals by an average distance that is less than the average particle size of the plurality of nanocrystals.

In some examples, the average density of the plurality of nanocrystals in the nanostructured conducting film can be $10^{15}$ nanocrystals/$cm^3$ or more (e.g., $2.5 \times 10^{15}$ nanocrystals/$cm^3$ or more, $5 \times 10^{15}$ nanocrystals/$cm^3$ or more, $7.5 \times 10^{15}$ nanocrystals/$cm^3$ or more, $1 \times 10^{16}$ nanocrystals/$cm^3$ or more, $2.5 \times 10^{16}$ nanocrystals/cm$^3$ or more, $5 \times 10^{16}$ nanocrystals/cm$^3$ or more, $7.5 \times 10^{16}$ nanocrystals/cm$^3$ or more, $1 \times 10^{17}$ nanocrystals/cm$^3$ or more, $2.5 \times 10^{17}$ nanocrystals/cm$^3$ or more, $5 \times 10^{17}$ nanocrystals/cm$^3$ or more, $7.5 \times 10^{17}$ nanocrystals/cm$^3$ or more, $1 \times 10^{18}$ nanocrystals/cm$^3$ or more, $2.5 \times 10^{18}$ nanocrystals/cm$^3$ or more, $5 \times 10^{18}$ nanocrystals/cm$^3$ or more, $7.5 \times 10^{18}$ nanocrystals/cm$^3$ or more, $1 \times 10^{19}$ nanocrystals/cm$^3$ or more, $2.5 \times 10^{19}$ nanocrystals/cm$^3$ or more, $5 \times 10^{19}$ nanocrystals/cm$^3$ or more, or $7.5 \times 10^{19}$ nanocrystals/cm$^3$ or more).

In some examples, the average density of nanocrystals in the nanostructured conducting film can be $10^{20}$ nanocrystals/cm$^3$ or less (e.g., $7.5 \times 10^{19}$ nanocrystals/cm$^3$ or less, $5 \times 10^{19}$ nanocrystals/cm$^3$ or less, $2.5 \times 10^{19}$ nanocrystals/cm$^3$ or less, $1 \times 10^{19}$ nanocrystals/cm$^3$ or less, $7.5 \times 10^{18}$ nanocrystals/cm$^3$ or less, $5 \times 10^{18}$ nanocrystals/cm$^3$ or less, $2.5 \times 10^{18}$ nanocrystals/cm$^3$ or less, $1 \times 10^{18}$ nanocrystals/cm$^3$ or less, $7.5 \times 10^{17}$ nanocrystals/cm$^3$ or less, $5 \times 10^{17}$ nanocrystals/cm$^3$ or less, $2.5 \times 10^{17}$ nanocrystals/cm$^3$ or less, $1 \times 10^{17}$ nanocrystals/cm$^3$ or less, $7.5 \times 10^{16}$ nanocrystals/cm$^3$ or less, $5 \times 10^{16}$ nanocrystals/cm$^3$ or less, $2.5 \times 10^{16}$ nanocrystals/cm$^3$ or less, $1 \times 10^{16}$ nanocrystals/cm$^3$ or less, $7.5 \times 10^{15}$ nanocrystals/cm$^3$ or less, $5 \times 10^{15}$ nanocrystals/cm$^3$ or less, or $2.5 \times 10^{15}$ nanocrystals/cm$^3$ or less).

The average density of the nanocrystals in the nanostructured conducting film can range from any of the minimum values described above to any of the maximum values described above. For example, the average density of the nanocrystals in the nanostructured conducting film can be from $10^{15}$ nanocrystals/cm$^3$ to $10^{20}$ nanocrystals/cm$^3$ (e.g., from $10^{15}$ nanocrystals/cm$^3$ to $10^{17}$ nanocrystals/cm$^3$, from $10^{17}$ nanocrystals/cm$^3$ to $10^{20}$ nanocrystals/cm$^3$ nanocrystals/cm$^3$, from $10^{15}$ nanocrystals/cm$^3$ to $10^{16}$ nanocrystals/cm$^3$, from $10^{16}$ nanocrystals/cm$^3$ to $10^{17}$ nanocrystals/cm$^3$, from $10^{17}$ nanocrystals/cm$^3$ to $10^{18}$ nanocrystals/cm$^3$, from $10^{18}$ nanocrystals/cm$^3$ to $10^{19}$ nanocrystals/cm$^3$, from $10^{19}$ nanocrystals/cm$^3$ to $10^{20}$ nanocrystals/cm$^3$, or from $10^{16}$ nanocrystals/cm$^3$ to $10^{19}$ nanocrystals/cm$^3$).

The plurality of nanocrystals can comprise nanocrystals of any shape (e.g., sphere, rod, cube, rectangle, octahedron, truncated octahedron, plate, cone, prism, ellipse, triangle, etc.). In some examples, the plurality of nanocrystals can have an isotropic shape. In some examples, the plurality of nanocrystals can have an anisotropic shape. In some examples, the plurality of nanocrystals are substantially spherical in shape.

The size, shape, and/or composition of the plurality of nanocrystals; the distance between each nanocrystal and its neighboring nanocrystals within the plurality of nanocrystals; the density of the plurality of nanocrystals in the nanostructured conducting film; or combinations thereof can be selected in view of a variety of factors. In some examples, the size, shape, and/or composition of the plurality of nanocrystals; the distance between each nanocrystal and its neighboring nanocrystals within the plurality of nanocrystals; the density of the plurality of nanocrystals in the nanostructured conducting film; or combinations thereof can be selected to tune the optical and/or electronic properties of the nanostructured conducting film.

In some examples, the second metal chalcogenide can comprise a metal oxide, a metal sulfide, a metal selenide, or combinations thereof. The second metal chalcogenide can, for example, be selected to tune the optical and/or electrical properties of the nanostructured conducting film.

In some examples, the second metal chalcogenide can comprise a metal oxide. Examples of metal oxides include simple metal oxides (e.g., with a single metal element) and mixed metal oxides (e.g., with different metal elements). The metal oxide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal oxide can comprise a metal selected from the group consisting of Cd, Cr, Cu, Ga, In, Ni, Sn, Ti, W, Zn, and combinations thereof. Examples of metal oxides include, but are not limited to, CdO, CdIn$_2$O$_4$, Cd$_2$SnO$_4$, Cr$_2$O$_3$, CuCrO$_2$, CuO$_2$, Ga$_2$O$_3$, In$_2$O$_3$, NiO, SnO$_2$, TiO$_2$, ZnGa$_2$O$_4$, ZnO, InZnO, InGaZnO, InGaO, ZnSnO, Zn$_2$SnO$_4$, CdSnO, WO$_3$, and combinations thereof.

In some examples, the second metal chalcogenide can comprise a metal sulfide. The metal sulfide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. In some examples, the metal sulfide can comprise a metal selected from the group consisting of Cd, Cu, Pb, Zn, and combinations thereof. Examples of metal sulfides include, but are not limited to, CdS, CuS, PbS, ZnS, or combinations thereof.

In some examples, the second metal chalcogenide can comprise a metal selenide. The metal selenide can, for example, comprise a metal selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. Examples of metal selenides include, but are not limited to, CuSe.

In some examples, the first metal chalcogenide and the second metal chalcogenide are the same.

In some examples, the continuous phase can further comprises a dopant. The dopant can comprise any suitable dopant for the second metal chalcogenide. The dopant can, for example, be selected to tune the optical and/or electronic properties of the nanostructured conducting film. In some examples, the dopant can comprise an n-type dopant. The dopant can, for example, comprise Al, B, Ce, Cl, Cs, Dy, Er, Eu, F, Ga, Gd, Ho, In, La, Mg, Mo, N, Nb, Nd, Sb, Sn, Sm, Tb, or combinations thereof.

The amount of dopant in the continuous phase can, for example, be selected to tune the optical and/or electronic properties of the nanostructured conducting film. In some examples, the concentration of the dopant in the continuous phase can be 0.1% or more (e.g., 0.5% or more, 1% or more, 2% or more, 3% or more, 4% or more, 5% or more, 6% or more, 7% or more, 8% or more, 9% or more, 10% or more, 11% or more, 12% or more, 13% or more, 14% or more, 15% or more, 16% or more, 17% or more, 18% or more, or 19% or more). In some examples, the concentration of the dopant in the continuous phase can be 20% or less (e.g., 19% or less, 18% or less, 17% or less, 16% or less, 15% or less, 14% or less, 13% or less, 12% or less, 11% or less, 10% or less, 9% or less, 8% or less, 7% or less, 6% or less, 5% or less, 4% or less, 3% or less, 2% or less, 1% or less, or 0.5% or less). The concentration of the dopant in the continuous phase can range from any of the minimum values described above to any of the maximum values described above. For example, the concentration of the dopant in the continuous phase can be from 0.1% to 20% (e.g., from 0.1% to 10%, from 10% to 20%, from 0.1% to 5%, from 5% to 10%, from 10% to 15%, from 15% to 20%, or from 1% to 15%). In some examples, the concentration of the dopant in the continuous phase can be 20% or more (e.g., 25% or more, 30% or more, 35% or more, 40% or more, 45% or more, or 50% or more). The concentration of the dopant can, for example, be a molar percent.

In some examples, the distribution of the dopant within the nanostructured conducting film can be heterogeneous. For example, the nanocrystal phase can comprise a dopant while the continuous phase does not comprise a dopant. In some examples, the continuous phase comprises a dopant while the nanocrystal phase does not comprise a dopant. In some examples, both the nanocrystal phase and the continuous phase can comprise a dopant wherein the identity of the dopant in the nanocrystal phase is different than the dopant in the continuous phase. In some examples, both the nanocrystal phase and the continuous phase can comprise a dopant wherein the concentration of the dopant in the nanocrystal phase is different than the concentration in the continuous phase. In some examples, the distribution of the dopant within the nanocrystal phase can be heterogeneous. For example, the nanocrystal phase can comprise a plurality of nanocrystals, wherein the plurality of nanocrystals comprises a first population of nanocrystals with a first concentration of dopant and a second population of nanocrystals with a second concentration of dopant. In some examples, the nanocrystal phase can comprise a plurality of nanocrystals, wherein the plurality of nanocrystals comprises a first population of nanocrystals with a first concentration of dopant and a second population of nanocrystals without any dopant. In some examples, the distribution of the dopant within each nanocrystal within the plurality of nanocrystals can be anisotropic. For example, the distribution of the dopant within each nanocrystal within the plurality of nanocrystals can be greater towards the surface of each nanocrystal than in the interior of each nanocrystal (e.g., a core-shell type distribution of dopant within each nanocrystal), or vice-versa.

In some examples, the nanostructured conducting films can be substantially optically transparent. For example, the nanostructured conducting film can have an average transmittance of 75% or more at one or more wavelengths from 350 nm to 800 nm (e.g., 76% or more, 77% or more, 78% or more, 79% or more, 80% or more, 81% or more, 82% or more, 83% or more, 84% or more, 85% or more, 86% or more, 87% or more, 88% or more, 89% or more, 90% or more, 91% or more, 92% or more, 93% or more, 94% or more, 95% or more, 96% or more, 97% or more, 98% or more, or 99% or more). In some examples, the nanostructured conducting film can have an average transmittance of 100% or less at one or more wavelengths from 350 nm to 800 nm (e.g., 99% or less, 98% or less, 97% or less, 96% or less, 95% or less, 94% or less, 93% or less, 92% or less, 91% or less, 90% or less, 89% or less, 88% or less, 87% or less, 86% or less, 85% or less, 84% or less, 83% or less, 82% or less, 81% or less, 80% or less, 79% or less, 78% or less, 77% or less, or 76% or less).

The average transmittance of the nanostructured conducting film at one or more wavelengths from 350 nm to 800 nm can range from any of the minimum values described above to any of the maximum valued described above. For example, the nanostructured conducting film can have an average transmittance of from 75% to 100% at one or more wavelengths from 350 nm to 800 nm (e.g., from 75% to 87%, from 87% to 100%, from 75% to 80%, from 80% to 85%, from 85% to 90%, from 90% to 95%, from 95% to 100%, or from 80% to 95%).

In some examples, the nanostructured conducting film can have a sheet resistivity of 1 $\Omega$/sq. or more (e.g., 5 $\Omega$/sq. or more, 10 $\Omega$/sq. or more, 15 $\Omega$/sq. or more, 20 $\Omega$/sq. or more, 25 $\Omega$/sq. or more, 30 $\Omega$/sq. or more, 35 $\Omega$/sq. or more, 40 $\Omega$/sq. or more, 45 $\Omega$/sq. or more, 50 $\Omega$/sq. or more, 60 $\Omega$/sq. or more, 70 $\Omega$/sq. or more, 80 $\Omega$/sq. or more, 90 $\Omega$/sq. or more, 100 $\Omega$/sq. or more, 125 $\Omega$/sq. or more, 150 $\Omega$/sq. or more, 175 $\Omega$/sq. or more, 200 $\Omega$/sq. or more, 225 $\Omega$/sq. or more, 250 $\Omega$/sq. or more, 275 $\Omega$/sq. or more, 300 $\Omega$/sq. or more, 325 $\Omega$/sq. or more, 350 $\Omega$/sq. or more, 375 $\Omega$/sq. or more, 400 $\Omega$/sq. or more, 425 $\Omega$/sq. or more, 450 $\Omega$/sq. or more, 475 $\Omega$/sq. or more, 500 $\Omega$/sq. or more, 550 $\Omega$/sq. or more, 600 $\Omega$/sq. or more, 650 $\Omega$/sq. or more, 700 $\Omega$/sq. or more, 750 $\Omega$/sq. or more, 800 $\Omega$/sq. or more, 850 $\Omega$/sq. or more, 900 $\Omega$/sq. or more, or 95 $\Omega$/sq. or more).

In some examples, the nanostructured conducting film can have a sheet resistivity of 1000 $\Omega$/sq. or less (e.g., 950 $\Omega$/sq. or less, 900 $\Omega$/sq. or less, 850 $\Omega$/sq. or less, 800 $\Omega$/sq. or less, 750 $\Omega$/sq. or less, 700 $\Omega$/sq. or less, 650 $\Omega$/sq. or less, 600 $\Omega$/sq. or less, 550 $\Omega$/sq. or less, 500 $\Omega$/sq. or less, 475 $\Omega$/sq. or less, 450 $\Omega$/sq. or less, 425 $\Omega$/sq. or less, 400 $\Omega$/sq. or less, 375 $\Omega$/sq. or less, 350 $\Omega$/sq. or less, 325 $\Omega$/sq. or less, 300 $\Omega$/sq. or less, 275 $\Omega$/sq. or less, 250 $\Omega$/sq. or less, 225 $\Omega$/sq. or less, 200 $\Omega$/sq. or less, 175 $\Omega$/sq. or less, 150 $\Omega$/sq. or less, 125 $\Omega$/sq. or less, 100 $\Omega$/sq. or less, 90 $\Omega$/sq. or less, 80 $\Omega$/sq. or less, 70 $\Omega$/sq. or less, 60 $\Omega$/sq. or less, 50 $\Omega$/sq. or less, 45 $\Omega$/sq. or less, 40 $\Omega$/sq. or less, 35 $\Omega$/sq. or less, 30 $\Omega$/sq. or less, 25 $\Omega$/sq. or less, 20 $\Omega$/sq. or less, 15 $\Omega$/sq. or less, 10 $\Omega$/sq. or less, or 5 $\Omega$/sq. or less).

The sheet resistivity of the nanostructured conducting film can range from any of the minimum values described above to any of the maximum values described above. For example, the nanostructured conducting film can have a sheet resistivity of from 1 $\Omega$/sq. to 1000 $\Omega$/sq. (e.g., from 1 $\Omega$/sq. to 500 $\Omega$/sq., from 500 $\Omega$/sq. to 1000 $\Omega$/sq., from 1 $\Omega$/sq. to 200 $\Omega$/sq., from 200 $\Omega$/sq. to 400 $\Omega$/sq., from 400 $\Omega$/sq. to 600 $\Omega$/sq., from 600 $\Omega$/sq. to 800 $\Omega$/sq., from 800 $\Omega$/sq. to 1000 $\Omega$/sq., from 1 $\Omega$/sq. to 100 $\Omega$/sq., or from 1 $\Omega$/sq. to 50 $\Omega$/sq.).

In some examples, the nanostructured conducting film can have a resistivity of $1\times10^{-5}$ $\Omega \cdot cm$ or more (e.g., $1.5\times10^{-5}$ $\Omega \cdot cm$ or more, $2\times10^{-5}$ $\Omega \cdot cm$ or more, $2.5\times10^{-5}$ $\Omega \cdot cm$ or more, $3\times10^{-5}$ $\Omega \cdot cm$ or more, $3.5\times10^{-5}$ $\Omega \cdot cm$ or more, $4\times10^{-5}$ $\Omega \cdot cm$ or more, $4.5\times10^{-5}$ $\Omega \cdot cm$ or more, $5\times10^{-5}$ $\Omega \cdot cm$ or more, $5.5\times10^{-5}$ $\Omega \cdot cm$ or more, $6\times10^{-5}$ $\Omega \cdot cm$ or more, $6.5\times10^{-5}$ $\Omega \cdot cm$ or more, $7\times10^{-5}$ $\Omega \cdot cm$ or more, $7.5\times10^{-5}$ $\Omega \cdot cm$ or more, $8\times10^{-5}$ $\Omega \cdot cm$ or more, $8.5\times10^{-5}$ $\Omega \cdot cm$ or more, $9\times10^{-5}$ $\Omega \cdot cm$ or more, $9.5\times10^{-5}$ $\Omega \cdot cm$ or more, $1\times10^{-4}$ $\Omega \cdot cm$ or more, $1.5\times10^{-4}$ $\Omega \cdot cm$ or more, $2\times10^{-4}$ $\Omega \cdot cm$ or more, $2.5\times10^{-4}$ $\Omega \cdot cm$ or more, $3\times10^{-4}$ $\Omega \cdot cm$ or more, $3.5\times10^{-4}$ $\Omega \cdot cm$ or more, $4\times10^{-4}$ $\Omega \cdot cm$ or more, or $4.5\times10^{-4}$ $\Omega \cdot cm$ or more).

In some examples, the nanostructured conducting film can have a resistivity of $5\times10^{-4}$ $\Omega \cdot cm$ or less (e.g., $4.5\times10^{-4}$ $\Omega \cdot cm$ or less, $4\times10^{-4}$ $\Omega \cdot cm$ or less, $3.5\times10^{-4}$ $\Omega \cdot cm$ or less, $3\times10^{-4}$ $\Omega \cdot cm$ or less, $2.5\times10^{-4}$ $\Omega \cdot cm$ or less, $2\times10^{-4}$ $\Omega \cdot cm$ or less, $1.5\times10^{-4}$ $\Omega \cdot cm$ or less, $1\times10^{-4}$ $\Omega \cdot cm$ or less, $9.5\times10^{-5}$ $\Omega \cdot cm$ or less, $9\times10^{-5}$ $\Omega \cdot cm$ or less, $8.5\times10^{-5}$ $\Omega \cdot cm$ or less, $8\times10^{-5}$ $\Omega \cdot cm$ or less, $7.5\times10^{-5}$ $\Omega \cdot cm$ or less, $7\times10^{-5}$ $\Omega \cdot cm$ or less, $6.5\times10^{-5}$ $\Omega \cdot cm$ or less, $6\times10^{-5}$ $\Omega \cdot cm$ or less, $5.5\times10^{-5}$ $\Omega \cdot cm$ or less, $5\times10^{-5}$ $\Omega \cdot cm$ or less, $4.5\times10^{-5}$ $\Omega \cdot cm$ or less, $4\times10^{-5}$ $\Omega \cdot cm$ or less, $3.5\times10^{-5}$ $\Omega \cdot cm$ or less, $3\times10^{-5}$ $\Omega \cdot cm$ or less, $2.5\times10^{-5}$ $\Omega \cdot cm$ or less, $2\times10^{-5}$ $\Omega \cdot cm$ or less, or $1.5\times10^{-5}$ $\Omega \cdot cm$ or less).

The resistivity of the nanostructured conducting film can range from any of the minimum values described above to any of the maximum values described above. For examples, the nanostructured conducting film can have a resistivity of from $1\times10^{-5}$ Ω·cm to $5\times10^{-4}$ Ω·cm (e.g., $1\times10^{-5}$ Ω·cm to $2.5\times10^{-4}$ Ω·cm, from $2.5\times10^{-4}$ Ω·cm to $5\times10^{-4}$ Ω·cm, from $1\times10^{-5}$ Ω·cm to $5\times10^{-5}$ Ω·cm, from $5\times10^{-5}$ Ω·cm to $1\times10^{-4}$ Ω·cm, from $1\times10^{-4}$ Ω·cm to $5\times10^{-4}$ Ω·cm, or from $2\times10^{-5}$ Ω·cm to $4\times10^{-4}$ Ω·cm)

In some examples, the nanostructured conducting film can have a carrier concentration of $5\times10^{18}$ cm$^{-3}$ or more (e.g., $7.5\times10^{18}$ cm$^{-3}$ or more, $1\times10^{19}$ cm$^{-3}$ or more, $2.5\times10^{19}$ cm$^{-3}$ or more, $5\times10^{19}$ cm$^{-3}$ or more, $7.5\times10^{19}$ cm$^{-3}$ or more, $1\times10^{20}$ cm$^{-3}$ or more, $2.5\times10^{20}$ cm$^{-3}$ or more, $5\times10^{20}$ cm$^{-3}$ or more, $7.5\times10^{20}$ cm$^{-3}$ or more, $1\times10^{21}$ cm$^{-3}$ or more, $2.5\times10^{21}$ cm$^{-3}$ or more). In some examples, the nanostructured conducting film can have a carrier concentration of $5\times10^{21}$ cm$^{-3}$ or less (e.g., $2.5\times10^{21}$ cm$^{-3}$ or less, $1\times10^{21}$ cm$^{-3}$ or less, $1\times10^{21}$ cm$^{-3}$ or less, $7.5\times10^{20}$ cm$^{-3}$ or less, $5\times10^{20}$ cm$^{-3}$ or less, $2.5\times10^{20}$ cm$^{-3}$ or less, $1\times10^{20}$ cm$^{-3}$ or less, $7.5\times10^{19}$ cm$^{-3}$ or less, $5\times10^{19}$ cm$^{-3}$ or less, $2.5\times10^{19}$ cm$^{-3}$ or less, $1\times10^{19}$ cm$^{-3}$ or less, $7.5\times10^{18}$ cm$^{3}$ or less).

The carrier concentration of the nanostructured conducting film can range from any of the minimum values described above to any of the maximum values described above. For example, the nanostructured conducting film can have a carrier concentration of from $5\times10^{18}$ cm$^{-3}$ to $5\times10^{21}$ cm$^{-3}$ (e.g., from $5\times10^{18}$ cm$^{3}$ to $1\times10^{19}$ cm$^{-3}$, from $1\times10^{19}$ cm$^{-3}$ to $5\times10^{21}$ cm$^{-3}$, from $5\times10^{18}$ cm$^{-3}$ to $1\times10^{19}$ cm$^{-3}$, from $1\times10^{19}$ cm$^{-3}$ to $5\times10^{19}$ cm$^{-3}$, from $1\times10^{19}$ cm$^{-3}$ to $5\times10^{19}$ cm$^{-3}$, from $5\times10^{19}$ cm$^{-3}$ to $1\times10^{20}$ cm$^{-3}$, from $1\times10^{20}$ cm$^{-3}$ to $5\times10^{20}$ cm$^{-3}$, from $5\times10^{20}$ cm$^{-3}$ to $1\times10^{21}$ cm$^{-3}$, from $1\times10^{21}$ cm$^{-3}$ to $5\times10^{21}$ cm$^{-3}$, or from $1\times10^{19}$ cm$^{-3}$ to $1\times10^{21}$ cm$^{3}$).

In some examples, the nanostructured conducting film can have a mobility of 1 cm$^{2}$V·s or more (e.g., 2 cm$^{2}$V·s or more, 3 cm$^{2}$V·s or more, 4 cm$^{2}$V·s or more, 5 cm$^{2}$V·s or more, 6 cm$^{2}$V·s or more, 7 cm$^{2}$V·s or more, 8 cm$^{2}$V·s or more, 9 cm$^{2}$V·s or more, 10 cm$^{2}$V·s or more, 15 cm$^{2}$V·s or more, 20 cm$^{2}$V·s or more, 25 cm$^{2}$V·s or more, 30 cm$^{2}$V·s or more, 35 cm$^{2}$V·s or more, 40 cm$^{2}$V·s or more, 45 cm$^{2}$V·s or more, 50 cm$^{2}$V·s or more, 60 cm$^{2}$V·s or more, 70 cm$^{2}$V·s or more, 80 cm$^{2}$V·s or more, 90 cm$^{2}$V·s or more, 100 cm$^{2}$V·s or more, 125 cm$^{2}$V·s or more, 150 cm$^{2}$V·s or more, 175 cm$^{2}$V·s or more, 200 cm$^{2}$V·s or more, 225 cm$^{2}$V·s or more, 250 cm$^{2}$V·s or more, 275 cm$^{2}$V·s or more, 300 cm$^{2}$V·s or more, 325 cm$^{2}$V·s or more, 350 cm$^{2}$V·s or more, 375 cm$^{2}$V·s or more, 400 cm$^{2}$V·s or more, 425 cm$^{2}$V·s or more, 450 cm$^{2}$V·s or more, or 475 cm$^{2}$V·s or more). In some examples, the nanostructured conducting film can have a mobility of 500 cm$^{2}$V·s or less (e.g., 475 cm$^{2}$V·s or less, 450 cm$^{2}$V·s or less, 425 cm$^{2}$V·s or less, 400 cm$^{2}$V·s or less, 375 cm$^{2}$V·s or less, 350 cm$^{2}$V·s or less, 325 cm$^{2}$V·s or less, 300 cm$^{2}$V·s or less, 275 cm$^{2}$V·s or less, 250 cm$^{2}$V·s or less, 225 cm$^{2}$V·s or less, 200 cm$^{2}$V·s or less, 175 cm$^{2}$V·s or less, 150 cm$^{2}$V·s or less, 125 cm$^{2}$V·s or less, 100 cm$^{2}$V·s or less, 90 cm$^{2}$V·s or less, 80 cm$^{2}$V·s or less, 70 cm$^{2}$V·s or less, 60 cm$^{2}$V·s or less, 50 cm$^{2}$V·s or less, 45 cm$^{2}$V·s or less, 40 cm$^{2}$V·s or less, 35 cm$^{2}$V·s or less, 30 cm$^{2}$V·s or less, 25 cm$^{2}$V·s or less, 20 cm$^{2}$V·s or less, 15 cm$^{2}$V·s or less, 10 cm$^{2}$V·s or less, 9 cm$^{2}$V·s or less, 8 cm$^{2}$V·s or less, 7 cm$^{2}$V·s or less, 6 cm$^{2}$V·s or less, 5 cm$^{2}$V·s or less, 4 cm$^{2}$V·s or less, 3 cm$^{2}$V·s or less, or 2 cm$^{2}$V·s or less).

The mobility of the nanostructured conducting film can range from any of the minimum values described above to any of the maximum values described above. For example, the nanostructured conducting film can have a mobility of from 1 cm$^{2}$V·s to 500 cm$^{2}$V·s (e.g., from 1 cm$^{2}$V·s to 250 cm$^{2}$V·s, from 250 cm$^{2}$V·s to 500 cm$^{2}$V·s, from 1 cm$^{2}$V·s to 100 cm$^{2}$V·s, from 100 cm$^{2}$V·s to 200 cm$^{2}$V·s, from 200 cm$^{2}$V·s to 300 cm$^{2}$V·s, from 300 cm$^{2}$V·s to 40 cm$^{2}$/V from 400 cm$^{2}$V·s to 500 cm$^{2}$V·s, or from 10 cm$^{2}$V·s to 450 cm$^{2}$V·s). In some examples, the nanostructured conducting film can have a mobility of 10 cm$^{2}$V·s or more. In some examples, the nanostructured conducting film can have a mobility of 15 cm$^{2}$V·s or more.

The nanostructured conducting film can, for example, have a conductivity of 1 S/cm or more (e.g., 50 S/m or more, 100 S/m or more, 150 S/m or more, 200 S/m or more, 250 S/m or more, 300 S/m or more, 350 S/m or more, 400 S/m or more, 450 S/m or more, 500 S/m or more, 550 S/m or more, 600 S/m or more, 650 S/m or more, 700 S/m or more, 750 S/m or more, 800 S/m or more, 850 S/m or more, 900 S/m or more, 950 S/m or more, 1000 S/m or more, 1250 S/m or more, 1500 S/m or more, 1750 S/m or more, 2000 S/m or more, 2250 S/m or more, 2500 S/m or more, 2750 S/m or more, 3000 S/m or more, 3250 S/m or more, 3500 S/m or more, 3750 S/m or more, 4000 S/m or more, 4250 S/m or more, 4500 S/m or more, 4750 S/m or more, 5000 S/m or more, 5500 S/m or more, 6000 S/m or more, 6500 S/m or more, 7000 S/m or more, 7500 S/m or more, 8000 S/m or more, 8500 S/m or more, 9000 S/m or more, or 9500 S/m or more,).

In some examples, the nanostructured conducting film can have a conductivity of 10,000 S/m or less (e.g., 9500 S/m or less, 9000 S/m or less, 8500 S/m or less, 8000 S/m or less, 7500 S/m or less, 7000 S/m or less, 6500 S/m or less, 6000 S/m or less, 5500 S/m or less, 5000 S/m or less, 4750 S/m or less, 4500 S/m or less, 4250 S/m or less, 4000 S/m or less, 3750 S/m or less, 3500 S/m or less, 3250 S/m or less, 3000 S/m or less, 2750 S/m or less, 2500 S/m or less, 2250 S/m or less, 2000 S/m or less, 1750 S/m or less, 1500 S/m or less, 1250 S/m or less, 1000 S/m or less, 950 S/m or less, 900 S/m or less, 850 S/m or less, 800 S/m or less, 750 S/m or less, 700 S/m or less, 650 S/m or less, 600 S/m or less, 550 S/m or less, 500 S/m or less, 450 S/m or less, 400 S/m or less, 350 S/m or less, 300 S/m or less, 250 S/m or less, 200 S/m or less, 150 S/m or less, 100 S/m or less, or 50 S/m or less).

The conductivity of the nanostructured conducting film can range from any of the minimum values described above to any of the maximum values described above. For example, the nanostructured conducting film can be from 1 S/cm to 10,000 S/cm (e.g., from 1 S/cm to 5000 S/cm, from 5000 S/cm to 10000 S/cm, from 1 S/cm to 2500 S/cm, from 2500 S/cm to 5000 S/cm, from 5000 S/cm to 7500 S/cm, from 7500 S/cm, or from 200 S/cm to 10000 S/cm).

In some examples, the nanostructured conducting films can comprise nanostructured transparent conducting oxide composite films. The nanostructured conducting films described herein can, for example, comprise transparent conducting oxide (TCO) films with heterogeneous dopant distribution.

Methods of Making

Also described herein are methods of making the nanostructured conducing films described herein. For example, also disclosed herein are methods of making the nanostructured conducting films described herein, the method comprising: depositing the plurality of nanocrystals on a substrate, thereby forming a nanocrystal phase; contacting the nanocrystal phase with a metal chalcogenide precursor, thereby forming an impregnated nanocrystal phase; and thermally annealing the impregnated nanocrystal phase, thereby forming the nanostructured conducting film. Depositing the plurality of nanocrystals can, for example, comprise printing, lithographic deposition, spin coating, drop-casting, zone casting, dip coating, blade coating, spraying, vacuum filtration, slot die coating, curtain coating, or combinations thereof.

In some examples, the nanocrystal phase is contacted with the metal chalcogenide precursor for 0.1 seconds or more (e.g., 0.5 seconds or more, 1 second or more, 2 seconds or more, 3 seconds or more, 4 seconds or more, 5 seconds or more, 6 seconds or more, 7 seconds or more, 8 seconds or more, 9 seconds or more, 10 seconds or more, 15 seconds or more, 20 seconds or more, 25 seconds or more, 30 seconds or more, 35 seconds or more, 40 seconds or more, 45 seconds or more, 50 seconds or more, 55 seconds or more, 1 minute or more, 2 minutes or more, 3 minutes or more, 4 minutes or more, 5 minutes or more, 6 minutes or more, 7 minutes or more, 8 minutes or more, 9 minutes or more, 10 minutes or more, 15 minutes or more, 20 minutes or more, 25 minutes or more, 30 minutes or more, 35 minutes or more, 40 minutes or more, 45 minutes or more, 50 minutes or more, or 55 minutes or more). In some examples, the nanocrystal phase can be contacted with the metal chalcogenide precursor for 1 hour or less (e.g., 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, 9 minutes or less, 8 minutes or less, 7 minutes or less, 6 minutes or less, 5 minutes or less, 4 minutes or less, 3 minutes or less, 2 minutes or less, 1 minute or less, 55 seconds or less, 50 seconds or less, 45 seconds or less, 40 seconds or less, 35 seconds or less, 30 seconds or less, 25 seconds or less, 20 seconds or less, 15 seconds or less, 10 seconds or less, 9 seconds or less, 8 seconds or less, 7 seconds or less, 6 seconds or less, 5 seconds or less, 4 seconds or less, 3 seconds or less, 2 seconds or less, 1 second or less, or 0.5 seconds or less).

The time for which the nanocrystal phase is contacted with the metal chalcogenide precursor can range from any of the minimum values described above to any of the maximum values described above. For example, the nanocrystal phase can be contacted with the metal chalcogenide precursor for from 0.1 seconds to 1 hour (e.g., from 0.1 seconds to 30 minutes, from 30 minutes to 1 hour, from 0.1 seconds to 20 minutes, from 20 minutes, to 40 minutes, from 40 minutes to 1 hour, or from 1 second to 55 minutes).

Also disclosed herein are methods of making the nanostructured conducting films described herein, the method comprising: dispersing the plurality of nanocrystals in a solution comprising a metal chalcogenide precursor, thereby forming a mixture; depositing the mixture on a substrate, thereby forming an impregnated nanocrystal phase; and thermally annealing the impregnated nanocrystal phase, thereby forming the nanostructured conducting film. Depositing the mixture can, for example, comprise printing, lithographic deposition, spin coating, drop-casting, zone casting, dip coating, blade coating, spraying, vacuum filtration, slot die coating, curtain coating, or combinations thereof.

The substrate can comprise any suitable substrate, for example, glass, quartz, silicon, a transparent polymer, MgO, Si, $TiO_2$, TaO, or combinations thereof.

Thermally annealing the impregnated nanocrystal phase can, in some examples, comprise heating the impregnated nanocrystal phase at a temperature of 200° C. or more (e.g., 225° C. or more, 250° C. or more, 275° C. or more, 300° C. or more, 325° C. or more, 350° C. or more, 375° C. or more, 400° C. or more, 425° C. or more, 450° C. or more, 475° C. or more, 500° C. or more, 525° C. or more, 550° C. or more, 575° C. or more, 600° C. or more, 625° C. or more, 650° C. or more, 675° C. or more, 700° C. or more, 725° C. or more, 750° C. or more, or 775° C. or more). In some examples, thermally annealing the impregnated nanocrystal phase can comprise heating the impregnated nanocrystal phase at a temperature of 800° C. or less (e.g., 775° C. or less, 750° C. or less, 725° C. or less, 700° C. or less, 675° C. or less, 650° C. or less, 625° C. or less, 600° C. or less, 575° C. or less, 550° C. or less, 525° C. or less, 500° C. or less, 475° C. or less, 450° C. or less, 425° C. or less, 400° C. or less, 375° C. or less, 350° C. or less, 325° C. or less, 300° C. or less, 275° C. or less, 250° C. or less, or 225° C. or less). The temperature at which the impregnated nanocrystal array is thermally annealed can range from any of the minimum values described above to any of the maximum values described above. For examples, thermally annealing the impregnated nanocrystal phase can comprise heating the impregnated nanocrystal phase at a temperature of from 200° C. to 800° C. (e.g., from 200° C. to 500° C., from 500° C. to 800° C., from 200° C. to 400° C., from 400° C. to 600° C., from 600° C. to 800° C., or from 250° C. to 750° C.).

The impregnated nanocrystal phase can, for example, be thermally annealed for 1 minute or more (e.g., 5 minutes or more, 10 minutes or more, 15 minutes or more, 20 minutes or more, 25 minutes or more, 30 minutes or more, 35 minutes or more, 40 minutes or more, 45 minutes or more, 50 minutes or more, 55 minutes or more, 1 hour or more, 2 hours or more, 3 hours or more, 4 hours or more, 5 hours or more, 6 hours or more, 7 hours or more, 8 hours or more, 9 hours or more, 10 hours or more, or 11 hours or more). In some examples, the impregnated nanocrystal phase can be thermally annealed for 12 hours or less (e.g., 11 hours or less, 10 hours or less, 9 hours or less, 8 hours or less, 7 hours or less, 6 hours or less, 5 hours or less, 4 hours or less, 3 hours or less, 2 hours or less, 1 hour or less, 55 minutes or less, 50 minutes or less, 45 minutes or less, 40 minutes or less, 35 minutes or less, 30 minutes or less, 25 minutes or less, 20 minutes or less, 15 minutes or less, 10 minutes or less, or 5 minutes or less). The time for which the impregnated nanocrystal phase is thermally annealed can range from any of the minimum values described above to any of the maximum values described above. For example, the impregnated nanocrystal phase can be thermally annealed for from 1 minute to 12 hours (e.g., from 1 minute to 6 hours, from 6 hours to 12 hours, from 1 minute to 3 hours, from 3 hours to 6 hours, from 6 hours to 9 hours, from 9 hours to 12 hours, from 10 minutes to 10 hours, or from 1 minute to 2 hours).

The impregnated nanocrystal phase can be thermally annealed, for example, in air, $H_2$, $N_2$, Ar, or combinations thereof.

In some examples, the metal chalcogenide precursor can comprise a solution comprising a metal salt.

In some examples, the methods can further comprise forming the plurality of nanocrystals.

In some examples, described herein are transparent conducting oxide (TCO) films with heterogeneous dopant distribution fabricated using infiltration of molecular precursors onto nanocrystal arrays. In some examples, described herein are transparent conducting oxide (TCO) films with heterogeneous dopant distribution fabricated combining the nanocrystals with other components and depositing in one step.

Methods of Use

Also provided herein are methods of use of the nanostructured conducting films described herein. For example, the nanostructured conducting electrodes described herein can be used as conductors in, for example, transistors, solar cells, and light emitting diodes (LEDs). Such devices can be fabricated by methods known in the art.

In some examples, the nanostructured conducing films described herein can be used in various articles of manufacture including electronic devices, energy storage devices, energy conversion devices, optical devices, optoelectronic devices, or combinations thereof. Examples of articles of manufacture (e.g., devices) using the nanostructured conducting films described herein can include, but are not limited to touch panels, electronic displays, transistors, smart windows, solar cells, fuel cells, photovoltaic cells, and combinations thereof. Such articles of manufacture can be fabricated by methods known in the art.

The examples below are intended to further illustrate certain aspects of the methods and compounds described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1

Described herein are transparent conducting oxide (TCO) films with heterogeneous dopant distribution fabricated using infiltration of molecular precursors onto nanocrystal arrays. Alternatively, the TCO films can be made by combining the nanocrystals with other components and depositing in one step.

The transparent conducting oxide films discussed herein can, for example, have a heterogeneous structure (e.g., heterogeneous with respect to dopant concentration and the nature of the host material), where the matrix and embedded nanocrystals have distinct composition. The dopant distribution can also be controlled within the nanocrystals. These parameters can be used to tune the optical and/or electronic properties of the TCO films, e.g., for optimal performance for a desired application.

Traditional methods for fabricating TCOs include, for example, sputtering, and sol-gel methods, which have been used to make TCO films with conductivities up to 5700 S/cm and 4700 S/cm, respectively. However, both sputtering and sol-gel methods can be high cost. Therefore, low cost methods that can make TCO with comparable conductivities are desired. Solution based fabrication processes can enable cost-effective fabrication of the TCO films.

Fabricating TCOs using solution based methods from nanocrystals can be cost effective, and can allow for high solid loading, grain size control, and dopant distribution control. However, TCO films from nanocrystals can have low conductivities, which can be attributed, at least in part, to the gaps between the crystals (e.g., film porosity) and associated lack of connection leading to electron transport by electron hopping. To date the highest conductivity for a nanocrystal film reported is 384 S/cm (with a corresponding resistivity of $2.6 \times 10^{-3}$ Ω·cm) (Sun S et al. *J. Phys. Chem. C*, 2014, 118, 12017). While the highest conductivities for films made via sputtering and sol-gel are 6800 S/cm and 4700 S/cm, respectively (with corresponding resistivities of $1.4 \times 10^{-4}$ Ω·cm and $2.1 \times 10^{4}$ Ω·cm, respectively).

Conductivity can be described by the equation below:

$$\sigma = e n \mu$$

where $\sigma$ is the conductivity, e is the charge of an electron, n is the carrier concentration, and $\mu$ is the mobility. The mobility $\mu$ can further be described by the equation below:

$$\frac{1}{\mu} = \frac{1}{\mu_{impurity}} + \frac{1}{\mu_{gb}} + \frac{1}{\mu_{hopping}} + \frac{1}{\mu_{phonon}}$$

where $1/\mu_{impurity}$, $1/\mu_{gb}$, $1/\mu_{hopping}$, and $1/\mu_{phonon}$ are factors that affect mobility from impurity scattering, grain boundary scattering, hopping process, and phonon scattering, respectively.

As can be seen from the equations above, both mobility and carrier concentration affect conductivity. However, while the number of doping centers increases they can also act as scattering centers and thereby decrease mobility. The inverse correlation between mobility and carrier concentration has limited the conductivity values for degenerately doped TCO films (Tahar R B H et al. *J. Appl. Phys.* 1998, 83, 2631).

The TCO films discussed herein can have both high conductivity and high carrier concentrations by heterogeneous dopant distribution. As a model system, composite films comprising ITO and indium oxides by infiltration of undoped indium precursors onto ITO nanocrystal arrays were fabricated. The thin films exhibited high mobility of 15-30 cm$^2$/V s, which is comparable to undoped indium oxide films while having high carrier concentrations. Commercial ITO films usually show low mobilities (e.g., ~10 cm$^2$/V s) due to the impurity scattering from Sn$^{4+}$ cations. On the other hand, undoped indium oxide films have few charge carriers, resulting in low conductivity. Unlike the present technologies, the TCO films described herein can have both high mobility and high carrier concentrations by separating the doped and undoped regions, as electrons provided by the doped nanocrystals can be transported through the mobile undoped region.

Infiltration, or infilling, of a nanocrystal array, for example as shown in FIG. 1, can improve conductivity by providing a connection between the nanocrystal that can, for example, allow for metallic transport of the electrons instead of electron hopping. The infiltration can also lead to a dense TCO film.

Figure 2:
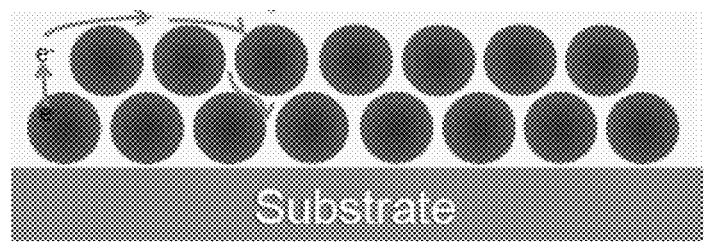
FIG. 2 is a schematic illustration of doped nanocrystals to provide electrons which can then be transported through the undoped regions.

As discussed above, doping centers can increase carrier concentration but can act as scattering centers and thereby decrease mobility. Meanwhile, infilling of undoped precursors into a nanocrystal array can maintain high conductivity by separating the undoped region and doped region. This separation can allow the doped nanocrystals to provide electrons (e.g., high carrier concentration) which can then be transported through the undoped region (e.g., high mobility), for example as illustrated in FIG. 2.

Figure 3:
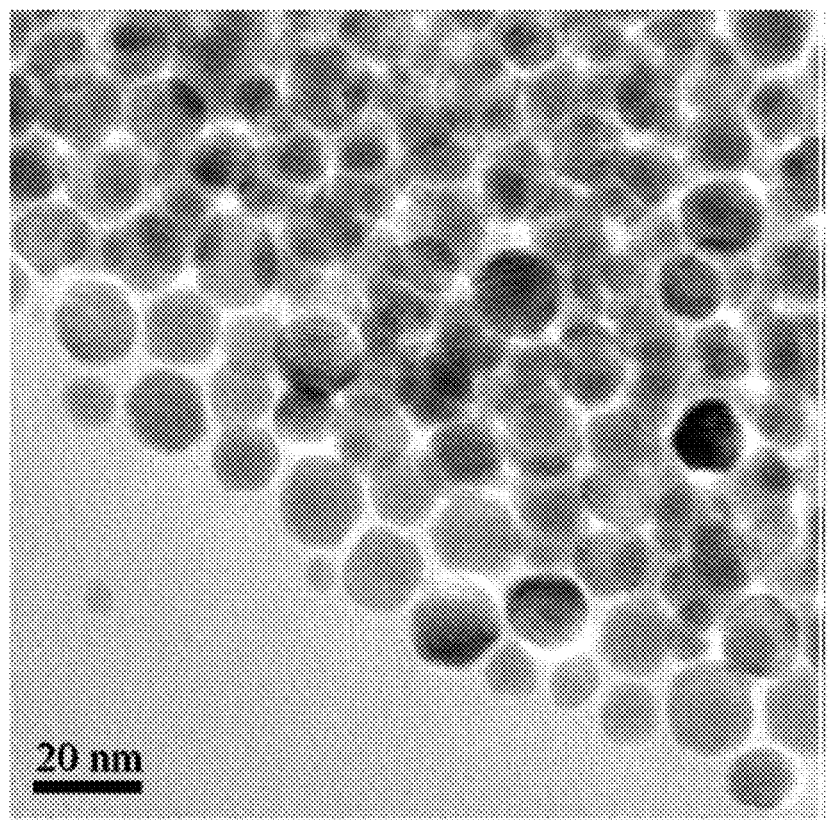
FIG. 3 is a transmission electron microscopy (TEM) image of nanocrystals comprising tin doped indium oxide, with a dopant concentration of 7.5% Sn, with an average particle size of 13 nm.
Figure 4:
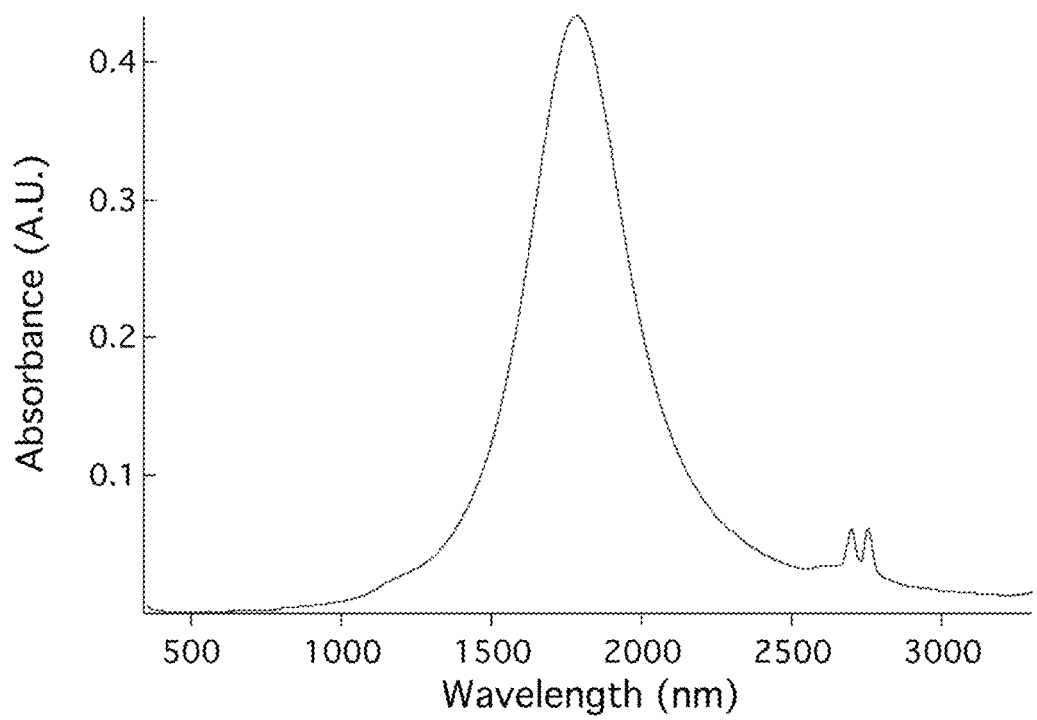
FIG. 4 is a near-IR optical spectrum of the nanocrystals shown in FIG. 3, which exhibits a localized surface plasmon resonance peak around 1780 nm.

A transmission electron microscopy (TEM) image (JEOL-2010 F, 200 eV acceleration voltage) of nanocrystals comprising tin doped indium oxide, with a dopant concentration of 7.5% Sn, with an average particle size of 13.5 nm (±3.0 nm) is shown in FIG. 3. The ITO nanocrystals exhibit a surface plasmon resonance peak centered at 1780 nm (FIG. 4, collected on Agilent-Cary5000 spectrophotometer). The plasmon resonance originated from free carrier oscillation of excess free electrons from degenerative n-type doping.

Figure 5:
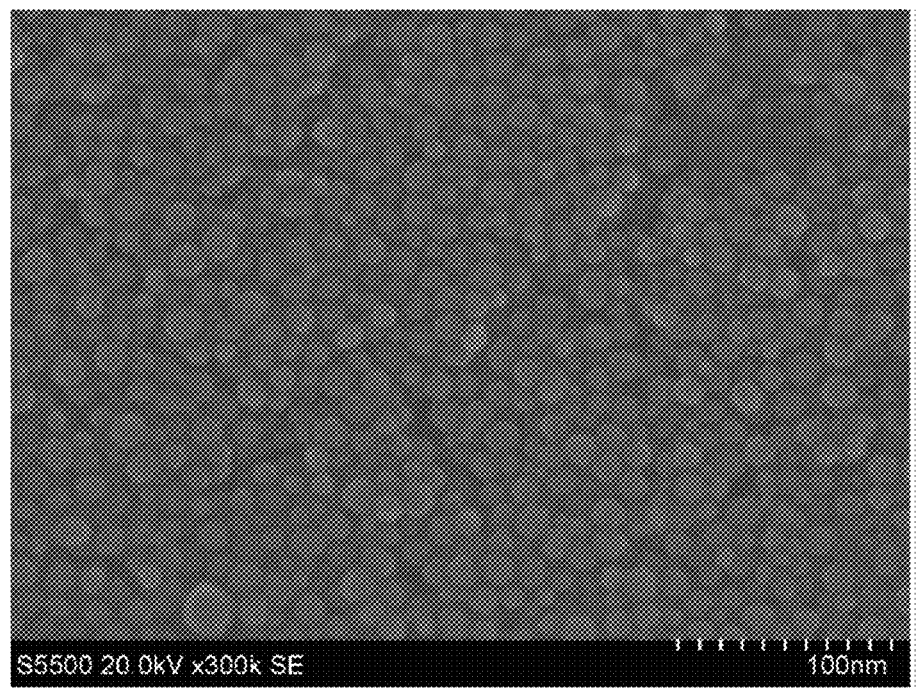
FIG. 5 is a scanning electron microscopy (SEM) image of a nanocrystal array.
Figure 6:
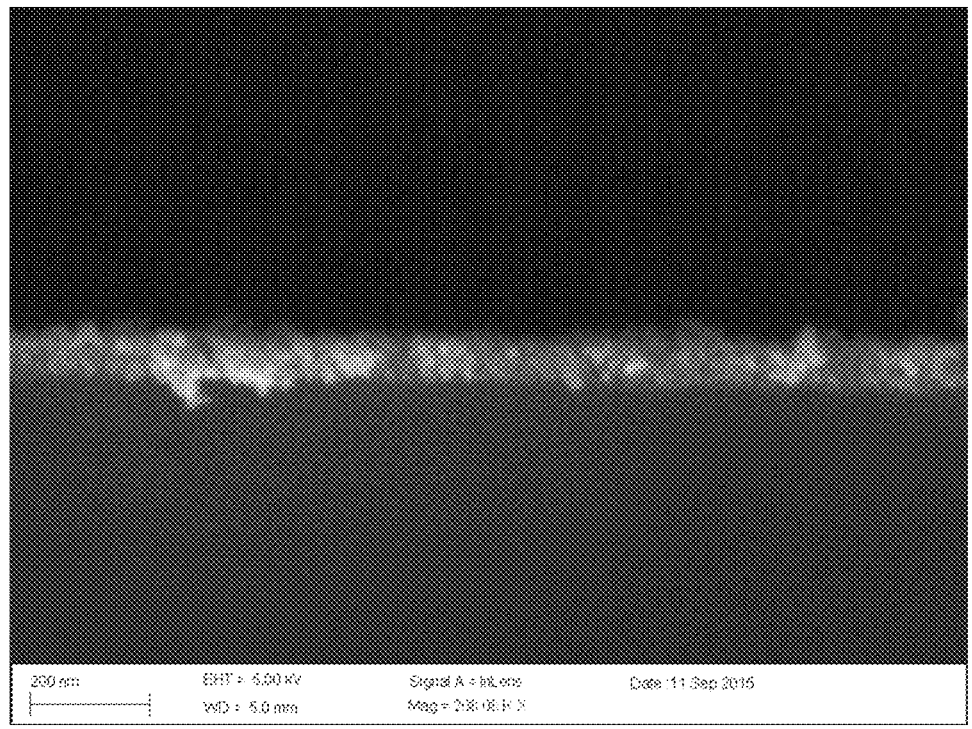
FIG. 6 is a cross-sectional SEM image of the film shown in FIG. 5.

Nanocrystal arrays were fabricated from these nanocrystals by forming 0.3-1 M dispersions of the nanocrystals in octane, and depositing the nanocrystals on a glass or Si substrate via spin coating (spin conditions were 2000 rpm for 90 seconds followed by 4000 rpm for 30 seconds). The deposited films were then dried at 120° C. for 15 minute to evaporate the octane from the film. The dried films were then annealed at 500° C. for 1 hour in air to fire out organic surfactants and residuals. A scanning electron microscopy (SEM) image (Hitachi 5500 SEM) of the film is shown in FIG. 5. By comparing with the TEM image of the original nanocrystals (FIG. 3), it can be seen that the nanocrystal grains retain their size and morphology during high temperature annealing (FIG. 5). The thickness of deposited films can be controlled by varying concentration of the nanocrystal dispersions. The nanocrystalline film formed by depositing the 0.3 M dispersion had a thickness of 73 nm, as determined from a cross-sectional SEM image of the film (FIG. 6). The nanocrystal film after annealing in 500° C. for 1 hour in the environment of 5% $H_2$/95% Ar exhibited a sheet resistance of 875 Ω/sq. and a conductivity of 157 S/cm (with a corresponding resistivity of $6.37 \times 10^{-3}$ Ω·cm), as determined using a four-point probe station.

In general, the infiltration method should be solution based as they are low cost, and allow for infilling efficiency, for example using small molecules (e.g., general sol-gel is not appropriate because sols are too big (~3 nm) to infiltrate efficiently onto small holes in nanocrystal arrays). As such, a combustion method involving the thermal decomposition of a metal nitrate-urea complex was investigated for the infiltration of TCO precursors into the nanocrystal film. The TCO precursors in the form of a metal nitrate-urea complex are generally stable until the decomposition temperature (e.g., 160-250° C.) is reached (Kim, M.-G. *Nature Mater.* 2011, 10, 382; Qin, S. et al. *Mater. Lett.* 2013, 91, 5). The combustion method can be used to deposit a dense film.

Figure 7:
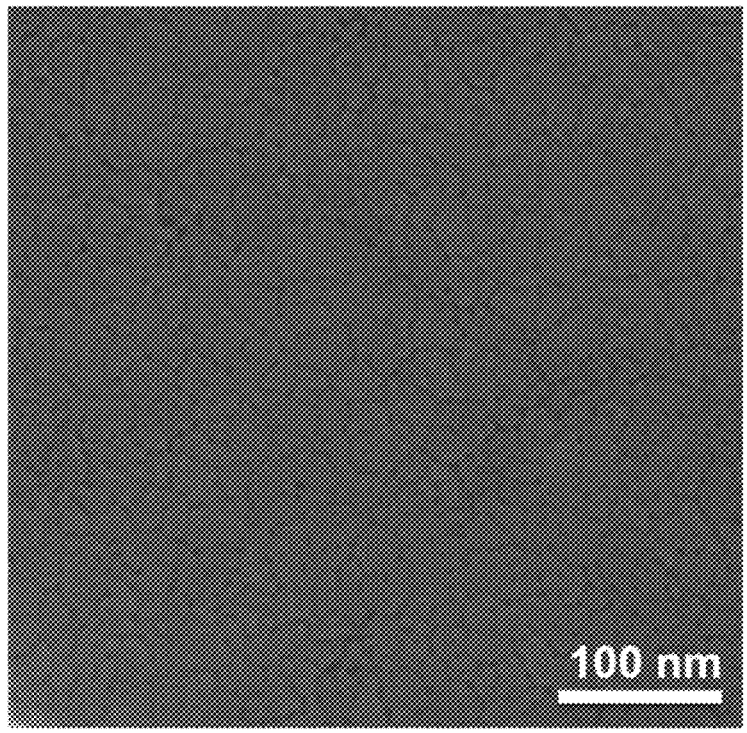
FIG. 7 is an SEM image of a composite film formed by the deposition of 0.3 indium precursor solution onto the nanocrystal array shown in FIG. 5.
Figure 8:
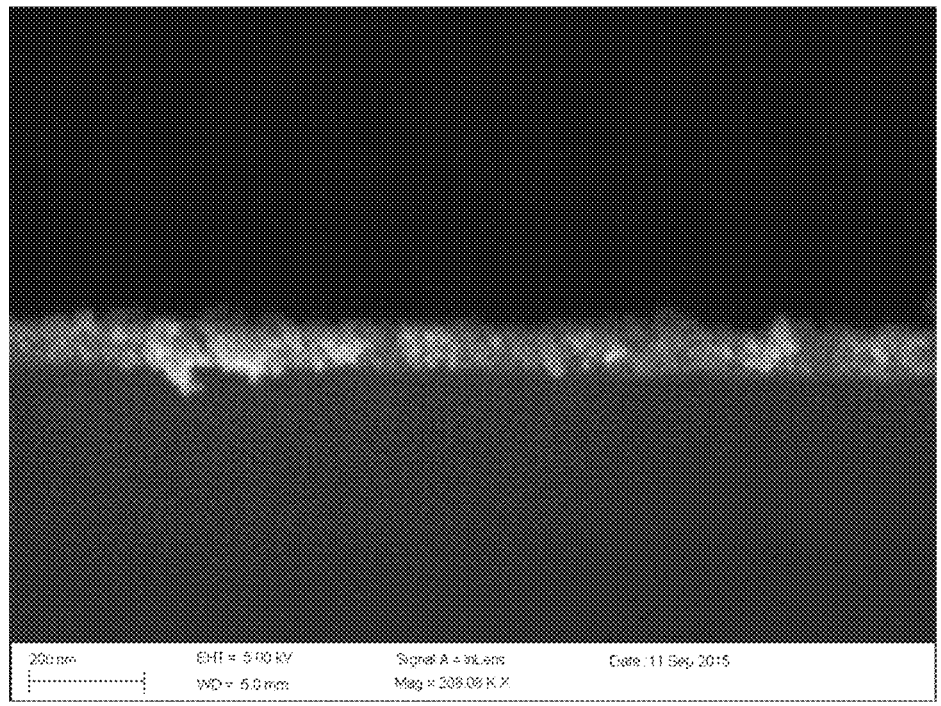
FIG. 8 is a cross-sectional SEM image of the film shown in FIG. 7.
Figure 9:
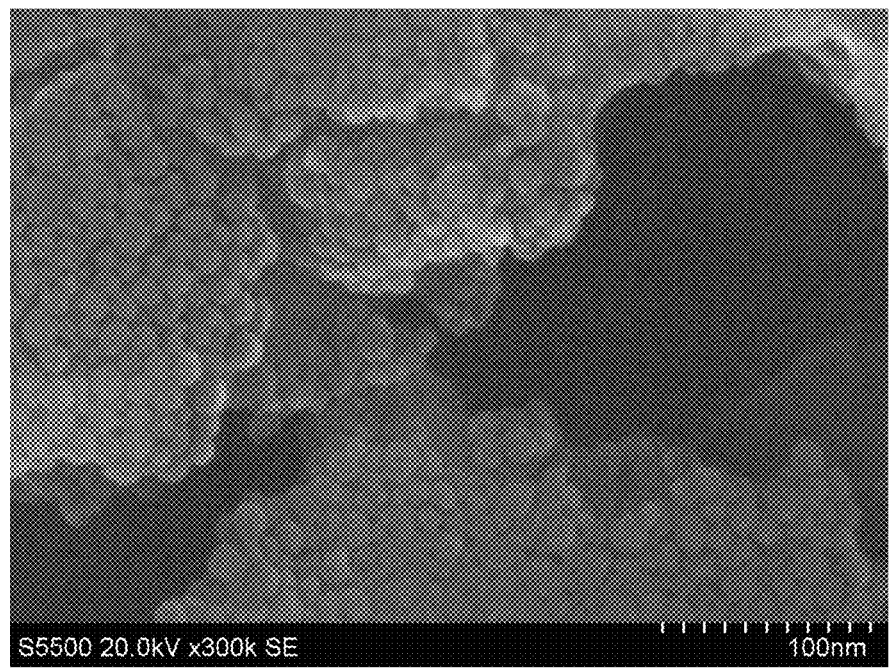
FIG. 9 is an SEM image of a scratch in the composite film shown in FIG. 7.
Figure 10:
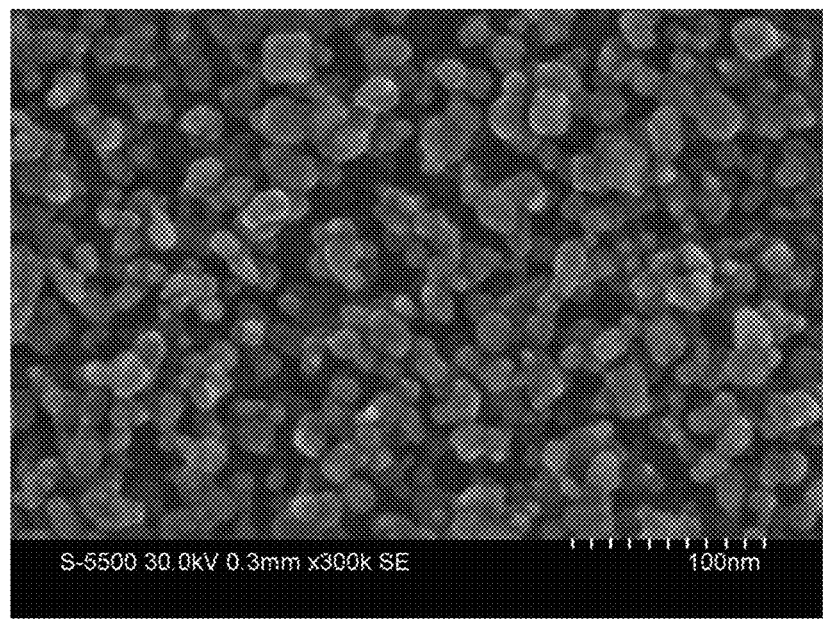
FIG. 10 is an SEM image of a composite film made by a deposition of conventional sol-gel solution onto a nanocrystal array.

The combustion method was used to deposit an indium oxide TCO film onto the nanocrystal film. Specifically, a solution comprising 0.3 M $In(NO_3)_3 \cdot xH_2O$ and 0.3 M urea in 2-methoxyethanol was dropped onto the nanocrystal array and left for 5 seconds, followed by spinning at 4000 rpm for 90 seconds. The nanocrystal film infiltrated with the precursors was then dried at 120° C. for 15 min to evaporate 2-methoxy ethanol solvent, annealed at 500° C. in air for firing out organic residuals, and finally annealed at 500° C. in 5% $H_2$/95% Ar to increase conductivity by removing interstitial oxygen and generating oxygen vacancies. A top-view SEM image of the composite film comprising both the nanocrystals and the infilled indium oxide is shown in FIG. 7. The composite film had a thickness of 87 nm, as determined from a cross-sectional SEM image of the film (FIG. 8). The thickness of the composite film was 14 nm thicker than that of the nanocrystal array (FIG. 6) demonstrating that the film consists of layer of indium oxide/ITO composite and indium oxide over-layer. Connection between nanocrystals in the composite film is found in a SEM image of a scratch in the composite film (FIG. 9). The composite film exhibited a sheet resistance of 165 Ω/sq. and a conductivity of 701 S/cm (with a corresponding resistivity of $1.43 \times 10^{-3}$ Ω·cm), meaning the composite film exhibited improved conductivity compared to the nanocrystal film alone. On the other hand, a composite films made using conventional sol-gel method instead of the combustion method is less conductive, even less conductive than the nanocrystal arrays, because of the high porosity and poor connectivity of the films (FIG. 10). The poor connectivity is because it is difficult to infiltrate pre-made sols sizes of 2-5 nm in the sol-gel solution into the small holes in the nanocrystal array.

Figure 11:
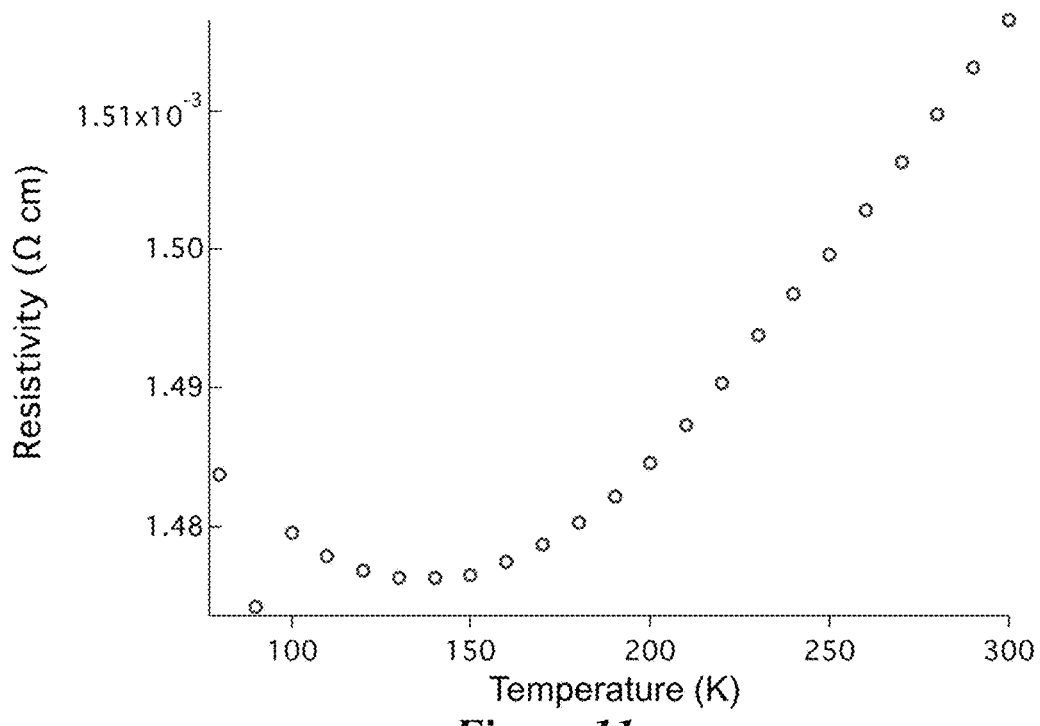
FIG. 11 shows the dependence of resistivity on temperature of a composite film formed by the deposition of 0.4 M indium and tin precursor (2% Sn) solution onto an ITO nanocrystal array with a thickness of 78 nm and a 7.5% doping level.
Figure 12:
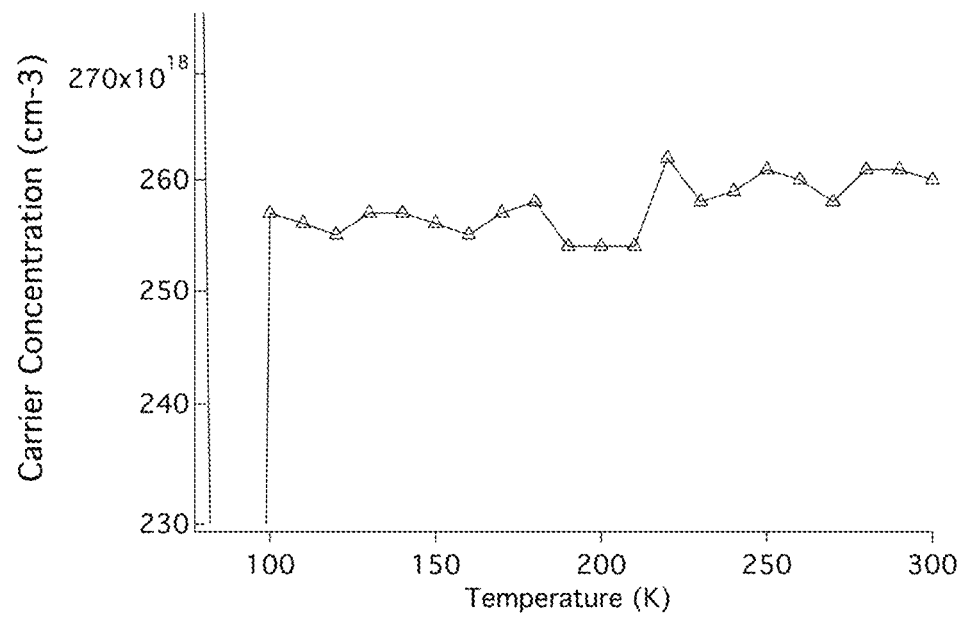
FIG. 12 shows the dependence of carrier concentration on temperature of the film shown in FIG. 11.
Figure 13:
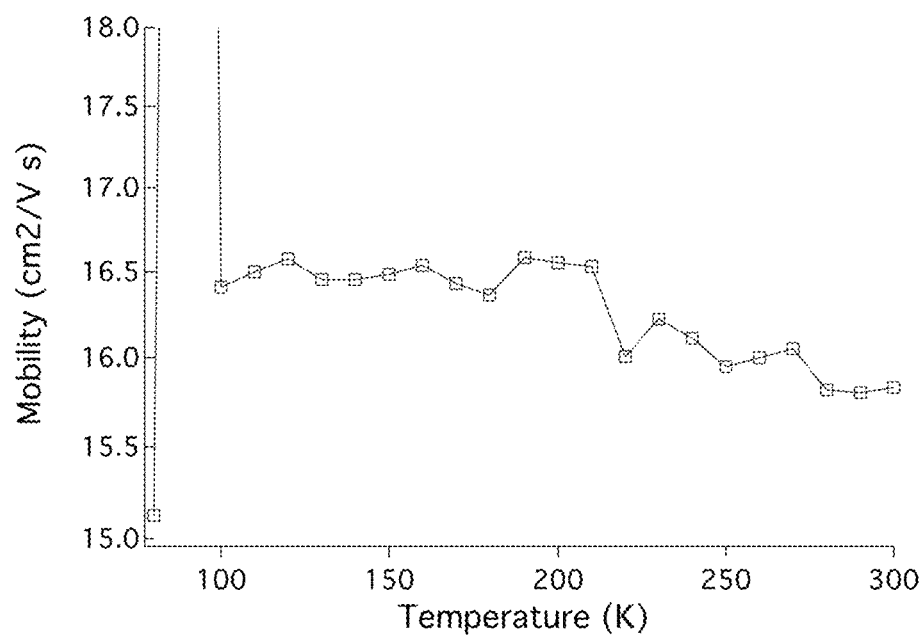
FIG. 13 shows the dependence of mobility on temperature of the film shown in FIG. 11.
Figure 14:
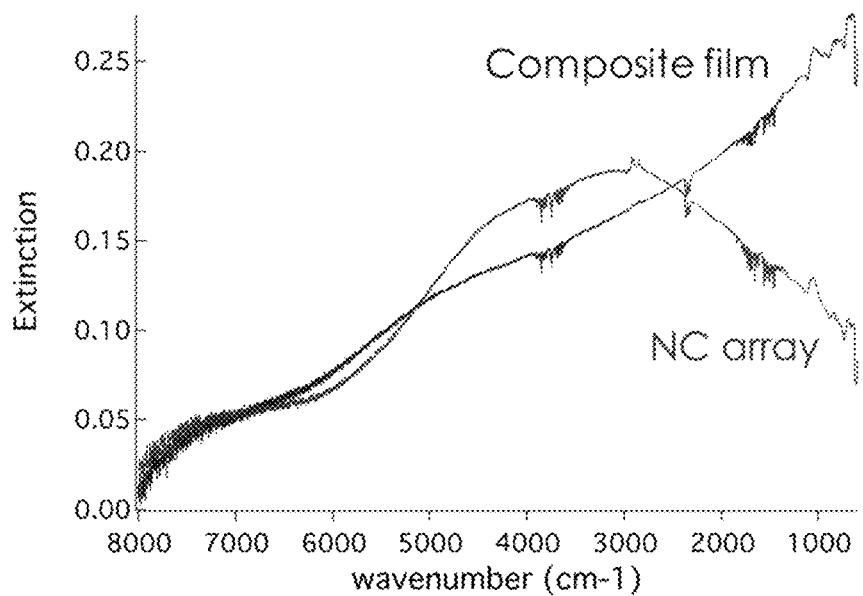
FIG. 14 shows the mid-infrared (mid-IR) optical spectra of a bare ITO nanocrystal (7.5% Sn) array with a thickness of 61 nm and a composite film formed by the deposition of 0.2 M indium precursor solution onto the nanocrystal array.

Investigation of the dependence of resistivity on temperature indicates that the composite films show metallic transport (FIG. 11). Resistivity increases linearly as temperature increases in a temperature range of 210-300 K and a temperature coefficient of resistivity (TCR) is $2.3 \times 10^{-4}$ $K^{-1}$, obtained by fitting the linear regime. The TCR value is comparable to commercial ITO films fabricated by sputtering (Dyer D E et al. *Thin Solid Films*, 1996, 288, 279), assuring reliability of the temperature-dependent resistivity data. Temperature-independent carrier concentration and temperature-dependent mobility data demonstrate that electrons are transported through the metallic band, not through the semiconductor conduction band or by a hopping mechanism (FIG. 12 and FIG. 13). Infiltration of molecular precursors onto ITO nanocrystal arrays can lead to connection between the nanocrystals (FIG. 9), which can induce electron delocalization, resulting in metallic transport. The electron delocalization is also confirmed by the red shift in the plasmon peak (FIG. 14).

Figure 15:
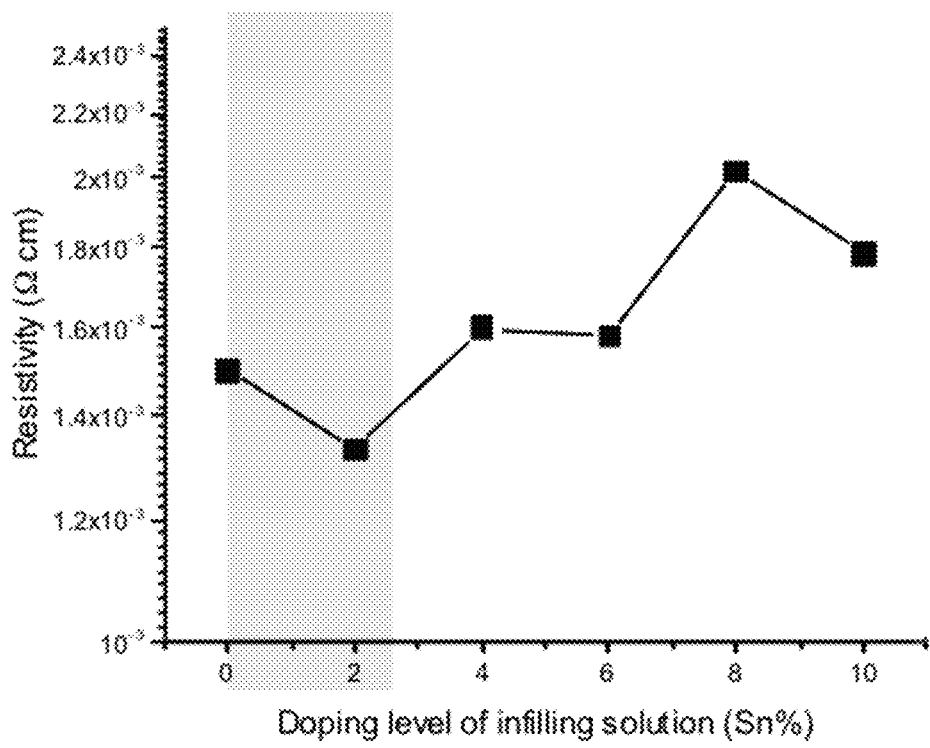
FIG. 15 displays a change of resistivity of composite films with the change of doping level of infilling solution. The graph shows that the infilling of low-doped solution onto respectively more heavily-doped nanocrystals lead to low resistivity.
Figure 16:
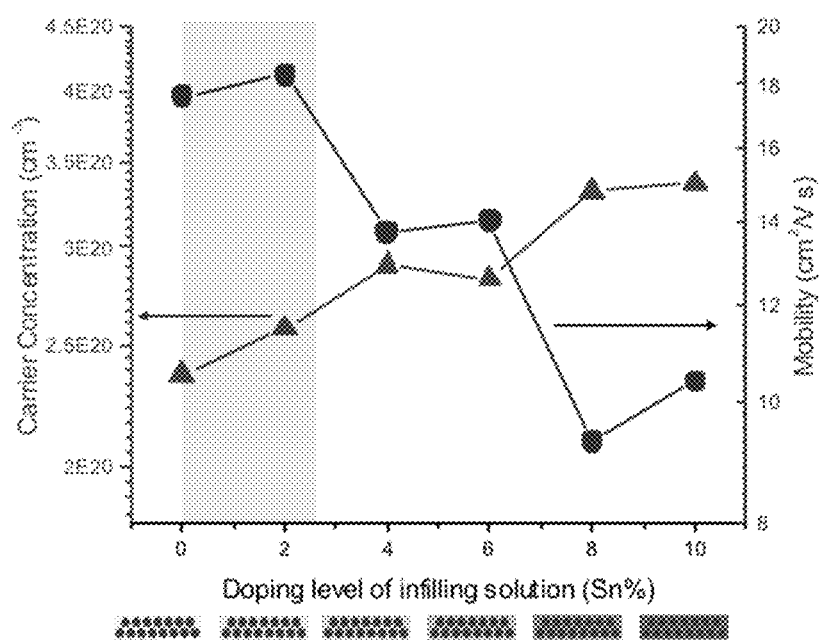
FIG. 16 displays a change of Hall parameters (mobility and carrier concentration) of the films shown in FIG. 15. The graphs show that the infilling of low-doped solution onto respectively more heavily-doped nanocrystals lead to both high mobility and high carrier concentration.

The results of a doping series experiment, that is controlling doping level of infilling solution from 0% to 10% tin level, are shown in FIG. 15 and FIG. 16. TCO films with heterogeneous dopant distribution, such as by infilling of low-doped solution onto respectively more heavily-doped nanocrystals, exhibited high conductivity (FIG. 15), which can be attributed at least in part to the separation of the mobile region and doping region, allowing for both high mobility (15-20 $cm^2/V \cdot s$) and high carrier concentration ($2-3 \times 10^{-20}$ $cm^{-3}$) as shown in the Hall measurement data (FIG. 16). Considering that undoped indium oxide ($In_2O_3$) has a mobility of 25-35 $cm^2/V \cdot s$, and tin doped indium oxide (ITO; 4-10% Sn doping) has a mobility of 10-13 $cm^2/V \cdot s$ (Seki et al. *Thin Solid Film*, 2001, 388, 22), the high mobility of the composite film can be attributed to the electron transport through the undoped or the low-doped regions, which have small number of scattering centers.

Figure 17:
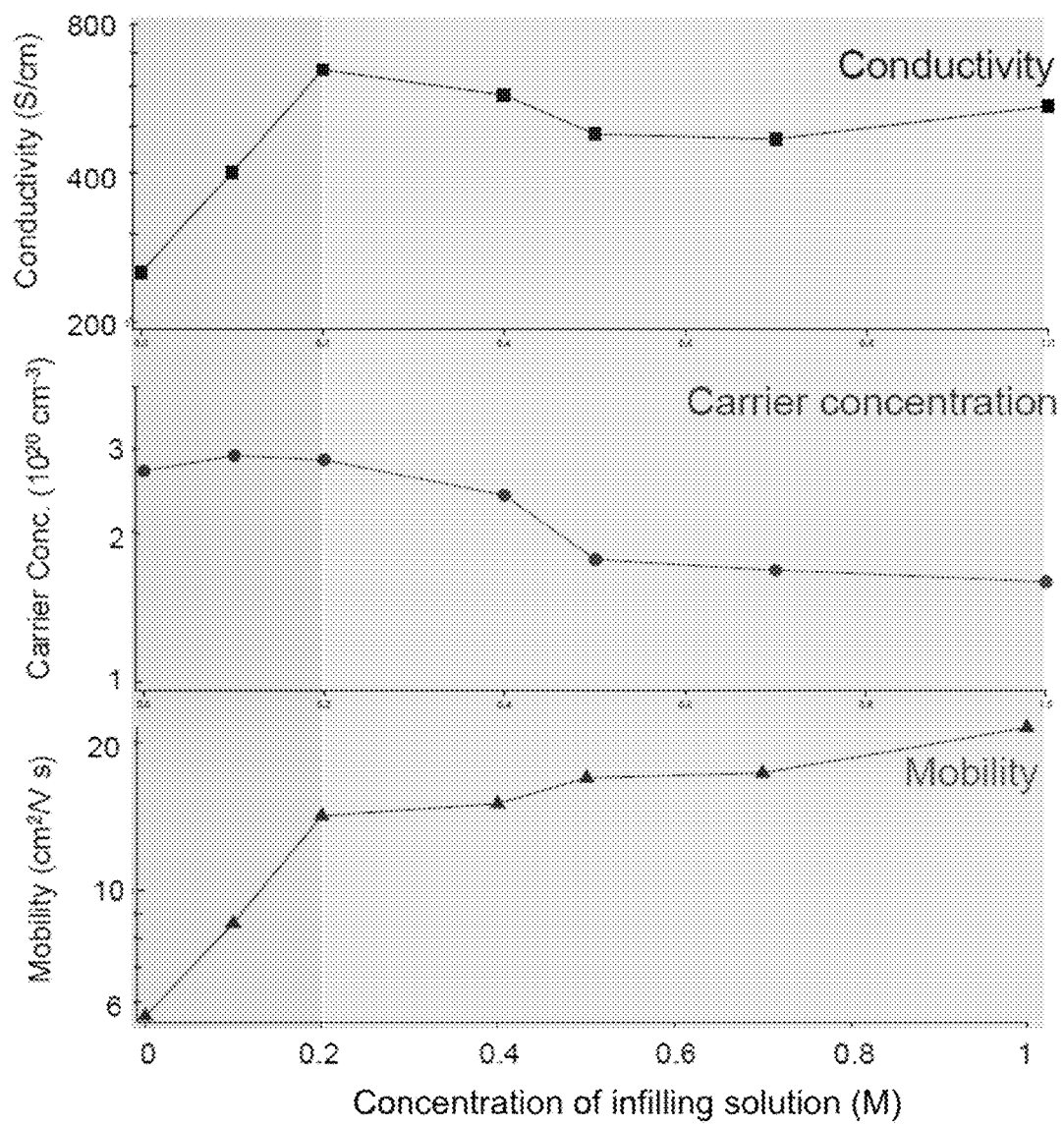
FIG. 17 displays a change of conductivity, carrier concentration and mobility for composite films with a change of concentration of infilling solution. The films were formed via the infiltration of various concentrations of indium precursor solutions onto a nanocrystal array with a thickness of 111 nm and a 9.6% dopant concentration.
Figure 18:
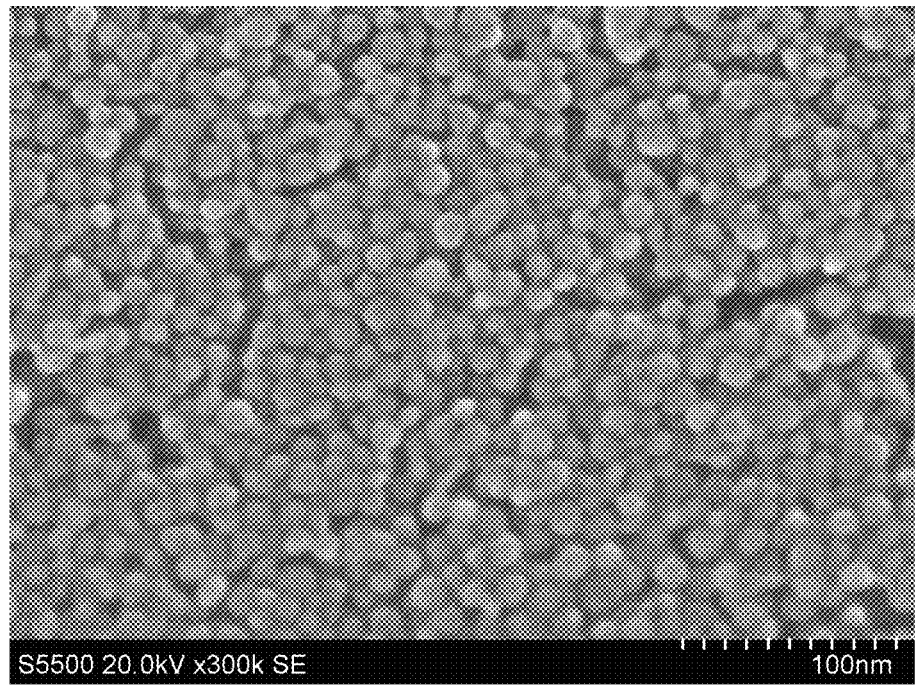
FIG. 18 is an SEM image of a composite film formed by the deposition of a 0.1 M undoped indium precursor solution onto a nanocrystal array with a thickness of 61 nm and a 7.5% doping level.
Figure 19:
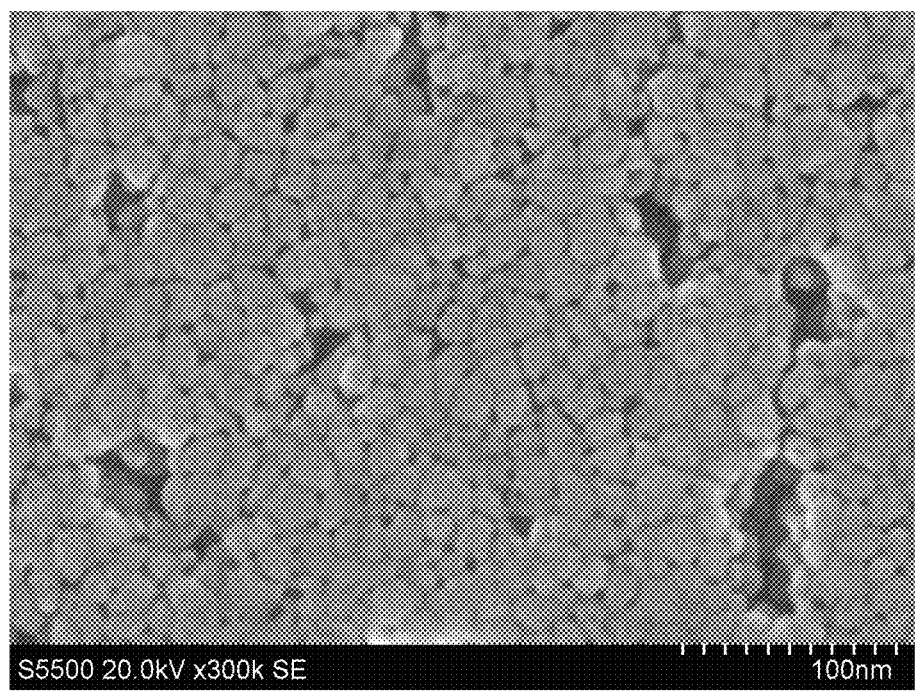
FIG. 19 is an SEM image of a composite film formed by the deposition of a 0.2 M undoped indium precursor solution onto a nanocrystal array with a thickness of 61 nm and a 7.5% dopant concentration.
Figure 20:
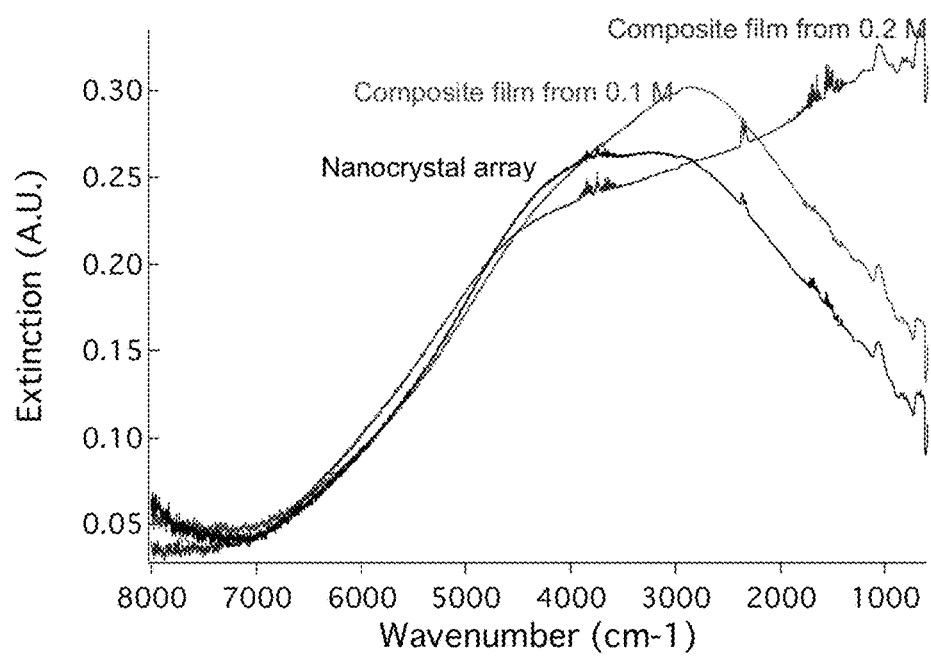
FIG. 20 shows the mid-infrared (mid-IR) optical spectra of a bare ITO nanocrystal (9.6%) array with a thickness of 111 nm and the composite films shown in FIGS. 18 and 19. The spectra shows red shift in the plasmon peak induced by electron delocalization due to infiltration of molecular precursors onto ITO nanocrystal arrays.

The results of a concentration series, that is controlling concentration of infilling undoped indium precursors, onto a nanocrystal array with a thickness of 110 nm and a 9.6% dopant concentration is shown in FIGS. 17-20. Conductivity of the nanocrystal array is 240 S/cm, while that of composite films formed from infiltration of 0.1 M and 0.2 M undoped indium precursors onto the nanocrystal arrays is 465 S/cm and 687 S/cm, respectively (FIG. 17). The conductivity change can be explained by the increase in connectivity between nanocrystals. SEM images show that infiltration of 0.2 M solution induced total filling of the holes in the nanocrystal array (FIG. 19), while that of 0.1 M solution resulted in partial filling (FIG. 18). The concentration dependent morphology change is consistent with optical data (FIG. 20). The plasmon peak of the films infiltrated by 0.1 M was 3000 $cm^{-1}$, which is red-shifted in comparison with that of nanocrystal array, 3400 $cm^{-1}$, representing interparticle plasmon coupling. The plasmon peak centered at 3000 cm$^{-1}$ is diminished and extinction at low energies increases due to delocalization of electrons after infiltration. Therefore, mobility increases as the concentration of the infilling solution increases in the range of 0-0.2 M. In the case of concentrated infilling solutions (0.3-1 M), the conductivity of composite film did not increase further because the holes are already completely infiltrated by >0.2 M solution (FIG. 17). Moreover, a thick undoped over-layer formed from the concentrated solutions can reduce the carrier concentration of the resulting composite films while mobility stays constant, in the case of >0.2 M solution, resulting in a decrease in conductivity.

Figure 21:
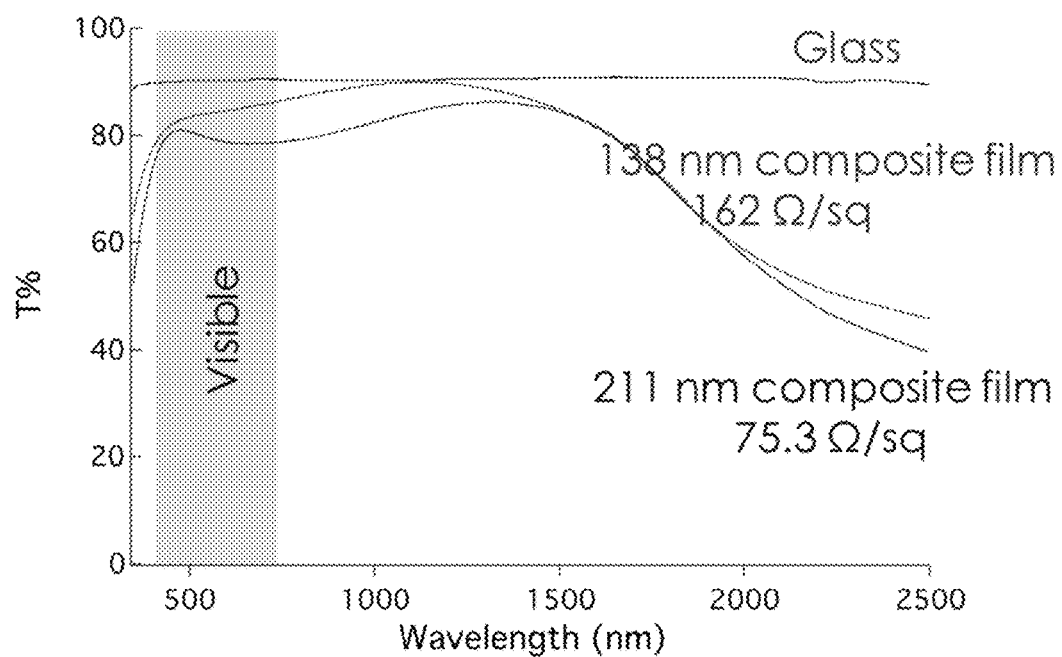
FIG. 21 shows the transparency of a glass substrate and two composite films.

The transparency of a glass substrate and two composite films of 138 nm and 211 nm are shown in FIG. 21. Both of the films have high transparency in visible range, allowing them to use as transparent devices. The decreased transparency >1500 nm is due to free carrier extinction.

The transparent conducting oxide films discussed herein can, for example, have a heterogeneous structure (e.g., heterogeneous with respect to dopant concentration and the nature of the host material), where the matrix and embedded nanocrystals have distinct composition. Different host materials and/or dopant distributions can be selected for different components of the nanostructured TCO film to tune the optical and/or electronic properties of the TCO films (e.g., transmittance, sheet resistance, refractive index), e.g., for optimal performance for a desired application.

Figure 22:
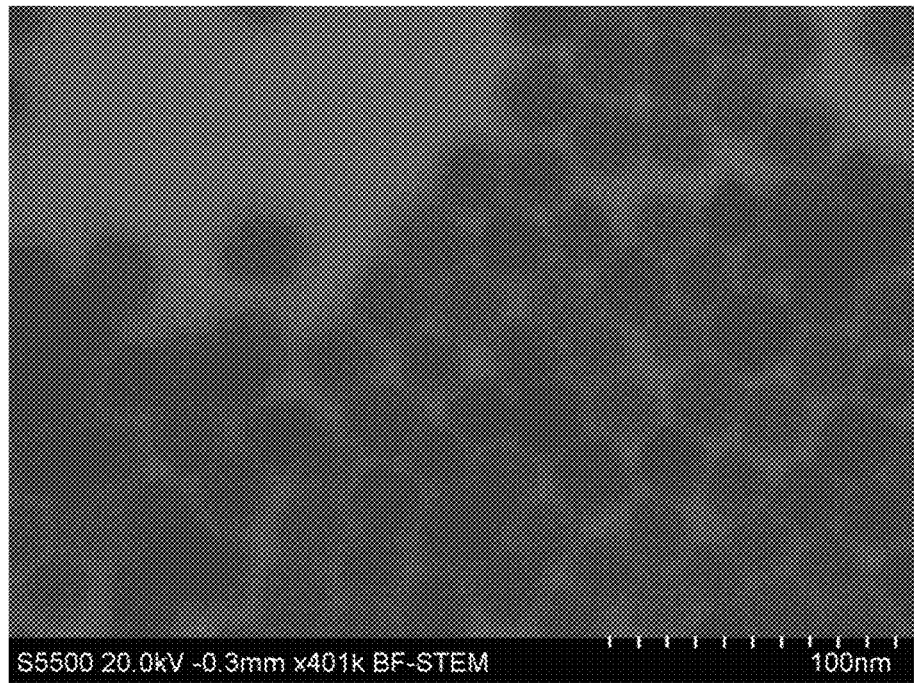
FIG. 22 is a STEM image of 21 nm sized cerium doped indium oxide nanocrystals.
Figure 23:
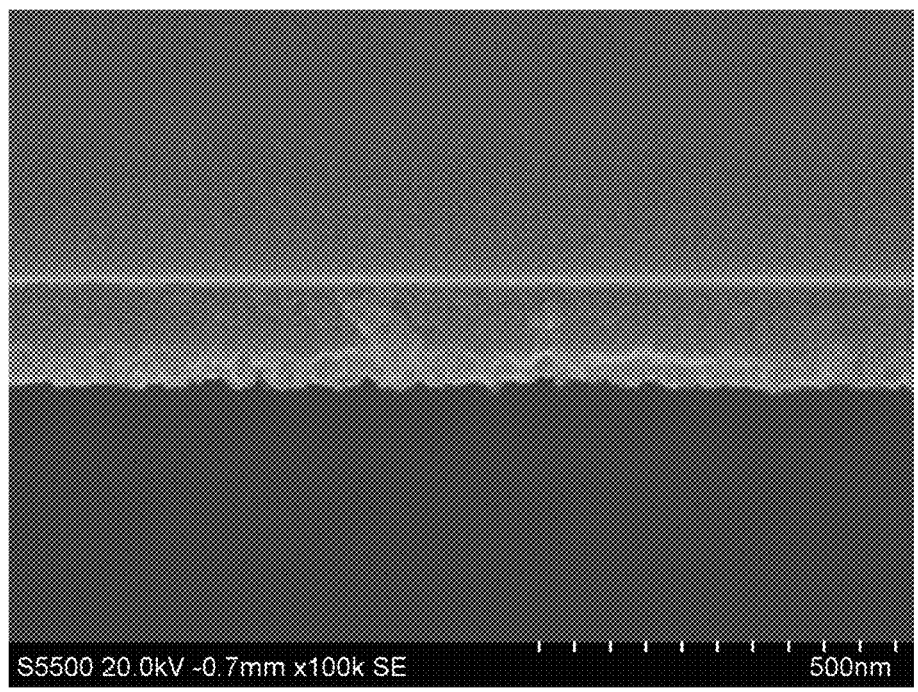
FIG. 23 is a cross-section SEM image of a composite film formed by the deposition of a 1 M undoped indium precursor solution.
Figure 24:
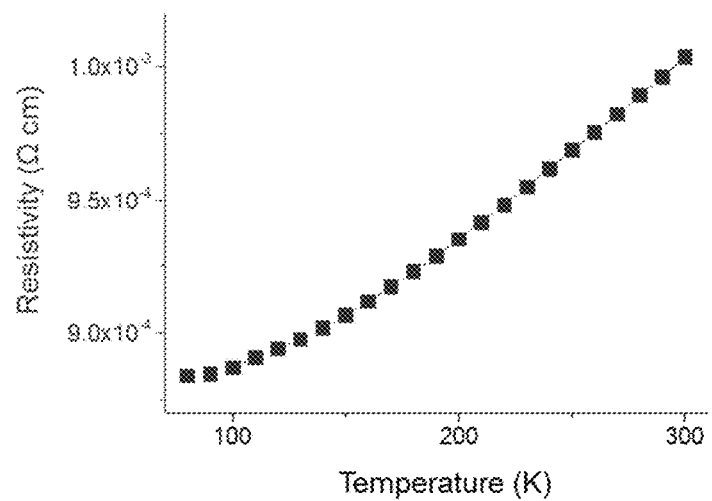
FIG. 24 shows the dependence of mobility on temperature for the film shown in FIG. 23.
Figure 25:
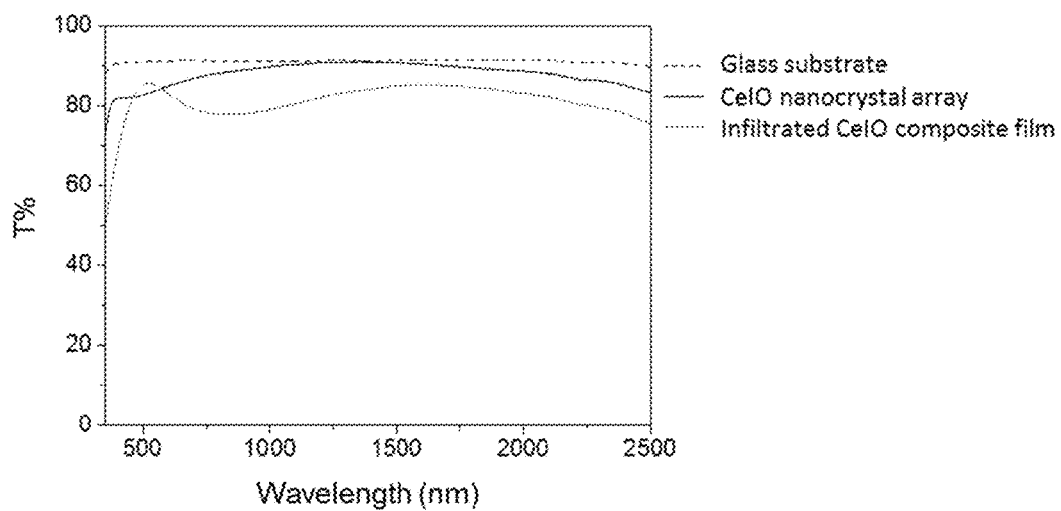
FIG. 25 shows the optical transmittance spectra of a glass substrate (dashed line, upper trace), a CeIO nanocrystal array (black solid line, middle trace), and an infiltrated CeIO composite film (solid grey line, bottom trace).

For example, nanocrystal-based TCO films with a mobility of 60 cm$^2$V·s were obtained by applying the infiltration process to cerium doped indium oxide (CeIO) nanocrystals. CeIO nanocrystals were synthesized via slow injection of indium(III) acetate and cerium(III) acetylacetonate hydrate into hot oleyl alcohol (290° C.). FIG. 22 shows a STEM image of 21 nm sized cerium doped indium oxide nanocrystals. CeIO nanocrystal-based TCO films were prepared by infiltration of undoped indium combustion precursors to CeIO nanocrystal arrays and an SEM image of the CeIO nanocrystal-based TCO films is shown in FIG. 23. The film also shows metallic transport mechanism (FIG. 24). The films show a conductivity of 800 S/cm, a carrier concentration of 8.28×10$^{19}$ cm$^{-3}$, and a mobility of 60.4 cm$^2$V·s. The high mobility can be attributed to the low level of impurity scattering and grain boundary scattering. In addition, the films are transparent in a broad range from visible 400 nm to infrared 2500 nm (FIG. 25). Relatively low levels of carrier concentration leads to the high transparency in the near-infrared regime.

The TCO films from infiltration of undoped precursors onto doped nanocrystal arrays shows the high mobility, which can be attributed to separation of the undoped region, which have high mobility, from the doped regions. Electrons from the doped regions can be transported through the undoped region, which has few scattering centers. The doped regions can comprise, for example, doped indium oxide (e.g., tin doped indium oxide (ITO), cerium doped indium oxide (CeIO), molybendum doped indium oxide (IMO)), doped zinc oxide (e.g., aluminum doped zinc oxide (AZO), gallium doped zinc oxide (GZO), indium doped zinc oxide (IZO)), or doped cadmium oxide (e.g., indium doped cadmium oxide (ICO)), while the undoped region can comprise indium oxide, zinc oxide, or cadmium oxide, respectively.

The methods discussed herein for fabricating composite TCOs by infiltration of precursors into nanocrystal arrays made using solution based methods, can be amenable to patterning, e.g., by gravure printing, inkjet printing, nanoimprint lithography, or roll-to-roll printing.

Infiltration of precursors into ITO nanocrystal arrays using the combustion method produced composite TCO films with high transparency (>91%) and high conductivity (1130 S/cm). The films formed from infiltration of undoped sol-gel onto ITO nanocrystal films showed high mobility, which can be attributed to the separation of the doped regions from the mobile undoped regions. The high mobility and high carrier concentration can enable the TCO films discussed herein to be used, for example, in touch panels, displays, solar cells, and smart windows.

The methods and compositions of the appended claims are not limited in scope by the specific methods and compositions described herein, which are intended as illustrations of a few aspects of the claims and any methods and compositions that are functionally equivalent are within the scope of this disclosure. Various modifications of the methods and compositions in addition to those shown and described herein are intended to fall within the scope of the appended claims. Further, while only certain representative methods, compositions, and aspects of these methods and compositions are specifically described, other methods and compositions and combinations of various features of the methods and compositions are intended to fall within the scope of the appended claims, even if not specifically recited. Thus a combination of steps, elements, components, or constituents can be explicitly mentioned herein; however, all other combinations of steps, elements, components, and constituents are included, even though not explicitly stated.

The methods and compositions of the appended claims are not limited in scope by the specific methods and compositions described herein, which are intended as illustrations of a few aspects of the claims and any methods and compositions that are functionally equivalent are within the scope of this disclosure. Various modifications of the methods and compositions in addition to those shown and described herein are intended to fall within the scope of the appended claims. Further, while only certain representative methods, compositions, and aspects of these methods and compositions are specifically described, other methods and compositions and combinations of various features of the methods and compositions are intended to fall within the scope of the appended claims, even if not specifically recited. Thus a combination of steps, elements, components, or constituents can be explicitly mentioned herein; however, all other combinations of steps, elements, components, and constituents are included, even though not explicitly stated.

What is claimed is:

1. A nanostructured conducting film comprising
    a nanocrystal phase comprising a plurality of nanocrystals comprising a first metal chalcogenide, the nanocrystal phase being dispersed within a continuous phase comprising a second metal chalcogenide,
    wherein each nanocrystal in the nanocrystal phase is separated from its neighboring nanocrystals by an average distance that is less than the average particle size of the plurality of nanocrystals,
    wherein the plurality of nanocrystals have an average particle size of from 1 nm to 90 nm, and
    wherein the nanocrystal phase, the continuous phase, or combinations thereof further comprises a dopant.

2. The nanostructured conducting film of claim 1, wherein the average density of the plurality of nanocrystals in the nanostructured conducting film is from 10$^{15}$ to 10$^{20}$ nanocrystals/cm$^3$.

3. The nanostructured conducting film of claim 1, wherein the first metal chalcogenide, the second metal chalcogenide, or a combination thereof comprises a metal oxide, a metal sulfide, a metal selenide, or combinations thereof.

4. The nanostructured conducting film of claim 3, wherein the first metal chalcogenide, the second metal chalcogenide, or a combination thereof comprises a metal selected from the group consisting of Cd, Cr, Cu, Ga, In, Ni, Sn, Ti, W, Pb, Zn, and combinations thereof.

5. The nanostructured conducting film of claim 3, wherein first metal chalcogenide, the second metal chalcogenide, or a combination thereof comprises CdO, $CdIn_2O_4$, $Cd_2SnO_4$, $Cr_2O_3$, $CuCrO_2$, $CuO_2$, $Ga_2O_3$, $In_2O_3$, NiO, $SnO_2$, $TiO_2$, $ZnGa_2O_4$, ZnO, InZnO, InGaZnO, InGaO, ZnSnO, $Zn_2SnO_4$, CdSnO, $WO_3$, CdS, CuS, PbS, ZnS, or combinations thereof.

6. A device comprising the nanostructured conducting film of claim 1, wherein the energy conversion device comprises an electronic device, an energy storage device, an energy conversion device, an optical device, an optoelectronic device, or combinations thereof.

7. The nanostructured conducting film of claim 1, wherein the dopant comprises an n-type dopant.

8. The nanostructured conducting film of claim 1, wherein the dopant comprises Al, B, Ce, Cl, Cs, Dy, Er, Eu, F, Ga, Gd, Ho, In, La, Mg, Mo, N, Nb, Nd, Sb, Sn, Sm, Tb, or combinations thereof.

9. The nanostructured conducting film of claim 1, wherein the concentration of the dopant in the nanocrystal phase, the continuous phase, or a combination thereof is from 0.1% to 20%.

10. The nanostructured conducting film of claim 1, wherein the first metal chalcogenide and the second metal chalcogenide are the same.

11. A method of use of the nanostructured conducting film of claim 1, the method comprising using the nanostructured conducting film in a touch panel, an electronic display, a smart window, a transistor, or a combination thereof.

12. The nanostructured conducting film of claim 1, wherein the nanostructured conducting film has an average transmittance of 75% or more at one or more wavelengths from 350 nm to 800 nm.

13. The nanostructured conducting film of claim 1, wherein the nanostructured conducting film has a sheet resistivity of 50Ω/sq. or less.

14. The nanostructured conducting film of claim 1, wherein the nanostructured conducting film has a resistivity of $5 \times 10^{-4}$ Ω·cm or less.

15. The nanostructured conducting film of claim 1, wherein the nanostructured conducting film has a carrier concentration of $5 \times 10^{18}$ $cm^{-3}$ or more.

16. The nanostructured conducting film of claim 1, wherein the nanostructured conducting film has a mobility of 10 $cm^2/V·s$ or more.

17. The nanostructured conducting film of claim 1, wherein the nanostructured conducting film has a conductivity of from 200 S/cm to 10,000 S/cm.

18. The nanostructured conducting film of claim 1, wherein the nanostructured conducting film comprises a nanostructured transparent conducting oxide composite film.

19. A method of making the nanostructured conducting film of claim 1, the method comprising:
   depositing the plurality of nanocrystals on a substrate, thereby forming the nanocrystal phase;
   contacting the nanocrystal phase with a metal chalcogenide precursor, thereby forming an impregnated nanocrystal phase; and
   thermally annealing the impregnated nanocrystal phase, thereby forming the nanostructured conducting film.

20. A method of making the nanostructured conducting film of claim 1, the method comprising:
   dispersing the plurality of nanocrystals in a solution comprising a metal chalcogenide precursor, thereby forming a mixture;
   depositing the mixture on a substrate, thereby forming an impregnated nanocrystal phase; and
   thermally annealing the impregnated nanocrystal phase, thereby forming the nanostructured conducting film.

21. The method of claim 19, wherein the metal chalcogenide precursor comprises a solution comprising a metal salt.

22. The method of claim 20, wherein the metal chalcogenide precursor comprises a solution comprising a metal salt.

* * * * *